(12) United States Patent
Lung et al.

(10) Patent No.: US 7,932,506 B2
(45) Date of Patent: Apr. 26, 2011

(54) FULLY SELF-ALIGNED PORE-TYPE MEMORY CELL HAVING DIODE ACCESS DEVICE

(75) Inventors: Hsiang-Lan Lung, Elmsford, NY (US); Chung Hon Lam, Peekskill, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 286 days.

(21) Appl. No.: 12/177,533

(22) Filed: Jul. 22, 2008

(65) Prior Publication Data

US 2010/0019221 A1    Jan. 28, 2010

(51) Int. Cl.
*H01L 29/02* (2006.01)

(52) U.S. Cl. .............. 257/2; 257/3; 257/4; 257/295; 257/E31.029; 365/100; 365/148; 365/163; 438/3; 438/900

(58) Field of Classification Search ................ None
See application file for complete search history.

(56) References Cited

U.S. PATENT DOCUMENTS

| | | | |
|---|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |

(Continued)

FOREIGN PATENT DOCUMENTS

WO    WO-0079539    12/2000

(Continued)

OTHER PUBLICATIONS

"Magnetic Bit Boost," www.sciencenews.org, Dec. 18 & 25, 2004, p. 389, vol. 166.

(Continued)

*Primary Examiner* — Evan Pert
*Assistant Examiner* — Scott Wilson
(74) *Attorney, Agent, or Firm* — Haynes Beffel & Wolfeld LLP

(57) ABSTRACT

Memory devices are described along with methods for manufacturing. A memory device as described herein includes a plurality of memory cells. Each memory cell in the plurality of memory cells comprises a diode comprising doped semiconductor material and a dielectric spacer on the diode and defining an opening, the dielectric spacer having sides self-aligned with sides of the diode. Each memory cell further comprises a memory element on the dielectric spacer and including a portion within the opening contacting a top surface of the diode.

22 Claims, 28 Drawing Sheets

U.S. PATENT DOCUMENTS

| | | |
|---|---|---|
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,805,563 B2 | 10/2004 | Ohashi et al. |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |

| | | | | | | |
|---|---|---|---|---|---|---|
| 7,269,052 B2 | 9/2007 | Segal et al. | | 2006/0289848 A1 | 12/2006 | Dennison |
| 7,277,317 B2 | 10/2007 | Le Phan et al. | | 2007/0008786 A1 | 1/2007 | Scheuerlein |
| 7,291,556 B2 | 11/2007 | Choi et al. | | 2007/0030721 A1 | 2/2007 | Segal et al. |
| 7,309,630 B2 | 12/2007 | Fan et al. | | 2007/0037101 A1 | 2/2007 | Morioka |
| 7,321,130 B2 | 1/2008 | Lung et al. | | 2007/0045606 A1 | 3/2007 | Magistretti et al. |
| 7,323,708 B2 | 1/2008 | Lee et al. | | 2007/0096162 A1 | 5/2007 | Happ et al. |
| 7,332,370 B2 | 2/2008 | Chang et al. | | 2007/0096248 A1 | 5/2007 | Philipp et al. |
| 7,336,526 B2 | 2/2008 | Osada et al. | | 2007/0108077 A1 | 5/2007 | Lung et al. |
| 7,351,648 B2 | 4/2008 | Furukawa et al. | | 2007/0108429 A1 | 5/2007 | Lung |
| 7,359,231 B2 | 4/2008 | Venkataraman et al. | | 2007/0108430 A1* | 5/2007 | Lung ............................. 257/4 |
| 7,364,935 B2 | 4/2008 | Lung et al. | | 2007/0108431 A1 | 5/2007 | Chen et al. |
| 7,365,385 B2 | 4/2008 | Abbott | | 2007/0109836 A1 | 5/2007 | Lung |
| 7,379,328 B2 | 5/2008 | Osada et al. | | 2007/0109843 A1 | 5/2007 | Lung et al. |
| 7,385,235 B2 | 6/2008 | Lung et al. | | 2007/0111429 A1 | 5/2007 | Lung |
| 7,394,088 B2 | 7/2008 | Lung | | 2007/0115794 A1 | 5/2007 | Lung |
| 7,397,060 B2 | 7/2008 | Lung | | 2007/0117315 A1 | 5/2007 | Lai et al. |
| 7,423,300 B2 | 9/2008 | Lung et al. | | 2007/0120104 A1 | 5/2007 | Ahn et al. |
| 7,426,134 B2 | 9/2008 | Happ et al. | | 2007/0121363 A1 | 5/2007 | Lung |
| 7,440,308 B2 | 10/2008 | Jeong et al. | | 2007/0121374 A1 | 5/2007 | Lung et al. |
| 7,449,710 B2 | 11/2008 | Lung | | 2007/0126040 A1 | 6/2007 | Lung |
| 7,479,649 B2 | 1/2009 | Lung | | 2007/0131922 A1 | 6/2007 | Lung |
| 2002/0070457 A1 | 6/2002 | Sun et al. | | 2007/0138458 A1 | 6/2007 | Lung |
| 2002/0113273 A1 | 8/2002 | Hwang et al. | | 2007/0147105 A1 | 6/2007 | Lung et al. |
| 2003/0072195 A1 | 4/2003 | Mikolajick | | 2007/0153563 A1 | 7/2007 | Nirschl |
| 2003/0095426 A1 | 5/2003 | Hush et al. | | 2007/0154847 A1 | 7/2007 | Chen et al. |
| 2003/0186481 A1 | 10/2003 | Lung | | 2007/0155172 A1 | 7/2007 | Lai et al. |
| 2004/0026686 A1 | 2/2004 | Lung | | 2007/0158632 A1 | 7/2007 | Ho |
| 2004/0051094 A1 | 3/2004 | Ooishi | | 2007/0158633 A1 | 7/2007 | Lai et al. |
| 2004/0113137 A1 | 6/2004 | Lowrey | | 2007/0158645 A1 | 7/2007 | Lung |
| 2004/0165422 A1 | 8/2004 | Hideki et al. | | 2007/0158690 A1 | 7/2007 | Ho et al. |
| 2004/0248339 A1 | 12/2004 | Lung | | 2007/0158862 A1 | 7/2007 | Lung |
| 2004/0256610 A1 | 12/2004 | Lung | | 2007/0161186 A1 | 7/2007 | Ho |
| 2005/0018526 A1 | 1/2005 | Lee | | 2007/0170881 A1 | 7/2007 | Noh et al. |
| 2005/0029502 A1 | 2/2005 | Hudgens | | 2007/0173019 A1 | 7/2007 | Ho et al. |
| 2005/0062087 A1 | 3/2005 | Chen et al. | | 2007/0173063 A1 | 7/2007 | Lung |
| 2005/0093022 A1 | 5/2005 | Lung | | 2007/0176261 A1 | 8/2007 | Lung |
| 2005/0127347 A1 | 6/2005 | Choi et al. | | 2007/0187664 A1 | 8/2007 | Happ |
| 2005/0127349 A1 | 6/2005 | Horak et al. | | 2007/0201267 A1 | 8/2007 | Happ et al. |
| 2005/0145984 A1 | 7/2005 | Chen et al. | | 2007/0215852 A1 | 9/2007 | Lung |
| 2005/0167656 A1 | 8/2005 | Sun et al. | | 2007/0224726 A1 | 9/2007 | Chen et al. |
| 2005/0191804 A1 | 9/2005 | Lai et al. | | 2007/0235811 A1 | 10/2007 | Furukawa et al. |
| 2005/0201182 A1 | 9/2005 | Osada et al. | | 2007/0236989 A1 | 10/2007 | Lung |
| 2005/0212024 A1 | 9/2005 | Happ | | 2007/0246699 A1 | 10/2007 | Lung |
| 2005/0212026 A1 | 9/2005 | Chung et al. | | 2007/0249090 A1 | 10/2007 | Philipp et al. |
| 2005/0215009 A1 | 9/2005 | Cho | | 2007/0257300 A1 | 11/2007 | Ho et al. |
| 2005/0263829 A1 | 12/2005 | Song et al. | | 2007/0262388 A1 | 11/2007 | Ho et al. |
| 2006/0006472 A1 | 1/2006 | Jiang | | 2007/0267721 A1* | 11/2007 | Kuh et al. ..................... 257/616 |
| 2006/0038221 A1 | 2/2006 | Lee et al. | | 2007/0274121 A1 | 11/2007 | Lung et al. |
| 2006/0066156 A1 | 3/2006 | Dong et al. | | 2007/0285960 A1 | 12/2007 | Lung et al. |
| 2006/0073642 A1 | 4/2006 | Yeh et al. | | 2007/0298535 A1 | 12/2007 | Lung |
| 2006/0091476 A1 | 5/2006 | Pinnow et al. | | 2008/0006811 A1 | 1/2008 | Philipp et al. |
| 2006/0094154 A1 | 5/2006 | Lung | | 2008/0012000 A1 | 1/2008 | Harshfield |
| 2006/0108667 A1 | 5/2006 | Lung | | 2008/0014676 A1 | 1/2008 | Lung et al. |
| 2006/0110878 A1 | 5/2006 | Lung et al. | | 2008/0025089 A1 | 1/2008 | Scheuerlein et al. |
| 2006/0110888 A1 | 5/2006 | Cho et al. | | 2008/0043520 A1 | 2/2008 | Chen |
| 2006/0113520 A1 | 6/2006 | Yamamoto et al. | | 2008/0094871 A1 | 4/2008 | Parkinson |
| 2006/0113521 A1 | 6/2006 | Lung | | 2008/0101110 A1 | 5/2008 | Happ et al. |
| 2006/0118913 A1 | 6/2006 | Yi et al. | | 2008/0137400 A1 | 6/2008 | Chen et al. |
| 2006/0124916 A1 | 6/2006 | Lung | | 2008/0164453 A1 | 7/2008 | Breitwisch et al. |
| 2006/0126395 A1 | 6/2006 | Chen et al. | | 2008/0165569 A1 | 7/2008 | Chen et al. |
| 2006/0131555 A1 | 6/2006 | Liu et al. | | 2008/0165570 A1 | 7/2008 | Happ et al. |
| 2006/0138467 A1 | 6/2006 | Lung | | 2008/0165572 A1 | 7/2008 | Lung |
| 2006/0154185 A1 | 7/2006 | Ho et al. | | 2008/0166875 A1 | 7/2008 | Lung |
| 2006/0157681 A1 | 7/2006 | Chen et al. | | 2008/0179582 A1 | 7/2008 | Burr et al. |
| 2006/0163554 A1 | 7/2006 | Lankhorst et al. | | 2008/0180990 A1 | 7/2008 | Lung |
| 2006/0175599 A1 | 8/2006 | Happ | | 2008/0186755 A1 | 8/2008 | Lung et al. |
| 2006/0198183 A1 | 9/2006 | Kawahara et al. | | 2008/0191187 A1 | 8/2008 | Lung et al. |
| 2006/0205108 A1 | 9/2006 | Maimon et al. | | 2008/0192534 A1 | 8/2008 | Lung |
| 2006/0211165 A1 | 9/2006 | Hwang et al. | | 2008/0197334 A1 | 8/2008 | Lung |
| 2006/0226409 A1 | 10/2006 | Burr et al. | | 2008/0224119 A1 | 9/2008 | Burr et al. |
| 2006/0234138 A1 | 10/2006 | Fehlhaber et al. | | 2008/0225489 A1 | 9/2008 | Cai et al. |
| 2006/0237756 A1 | 10/2006 | Park et al. | | 2008/0265234 A1 | 10/2008 | Breitwisch et al. |
| 2006/0266993 A1 | 11/2006 | Suh et al. | | 2009/0001341 A1 | 1/2009 | Breitwisch et al. |
| 2006/0284157 A1 | 12/2006 | Chen et al. | | 2009/0014704 A1 | 1/2009 | Chen et al. |
| 2006/0284158 A1 | 12/2006 | Lung et al. | | 2009/0023242 A1 | 1/2009 | Lung |
| 2006/0284214 A1 | 12/2006 | Chen | | 2009/0027950 A1 | 1/2009 | Lam et al. |
| 2006/0284279 A1 | 12/2006 | Lung et al. | | 2009/0042335 A1 | 2/2009 | Lung |
| 2006/0286709 A1 | 12/2006 | Lung et al. | | 2009/0057641 A1 | 3/2009 | Lung |
| 2006/0286743 A1 | 12/2006 | Lung et al. | | | | |

FOREIGN PATENT DOCUMENTS

| WO | WO-0145108 | 6/2001 |
|----|------------|--------|
| WO | WO-0225733 | 3/2002 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd EPCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

FULLY SELF-ALIGNED PORE-TYPE MEMORY CELL HAVING DIODE ACCESS DEVICE

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and other programmable resistive materials, and to methods for manufacturing such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state. It is desirable to minimize the magnitude of the reset current used to cause transition of phase change material from the crystalline state to the amorphous state.

The magnitude of the current needed for reset can be reduced by reducing the size of the phase change material element in the cell and/or the contact area between electrodes and the phase change material, such that higher current densities are achieved with small absolute current values through the phase change material element.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064 issued Aug. 6, 2002 to Wicker, "Reduced Contact Areas of Sidewall Conductor"; U.S. Pat. No. 6,462,353 issued Oct. 8, 2002 to Gilgen, "Method for Fabricating a Small Area of Contact Between Electrodes"; U.S. Pat. No. 6,501,111 issued Dec. 31, 2002 to Lowrey, "Three-Dimensional (3D) Programmable Device"; U.S. Pat. No. 6,563,156 issued Jul. 1, 2003 to Harshfield, "Memory Elements and Methods for Making Same."

Problems have arisen in manufacturing devices with very small dimensions, including alignment issues in manufacturing large-scale high-density memory devices.

It is therefore desirable to provide fully-self aligned memory cell structures having small dimensions and low reset currents, and methods for manufacturing such structures for use in large-scale high-density memory devices.

SUMMARY OF THE INVENTION

A memory device as described herein includes a plurality of memory cells. Each memory cell in the plurality of memory cells comprises a diode comprising doped semiconductor material and a dielectric spacer on the diode and defining an opening, the dielectric spacer having sides self-aligned with sides of the diode. Each memory cell in the plurality of memory cells further comprises a memory element on the dielectric spacer and including a portion within the opening contacting a top surface of the diode.

A method for manufacturing a memory device as described herein includes forming a structure comprising word line material, diode material on the word line material, dielectric spacer material on the diode material, and first sacrificial material on the layer of dielectric spacer material. A plurality of dielectric-filled first trenches are formed in the structure extending in a first direction to define a plurality of strips, each strip including a word line comprising word line material. Second sacrificial material is formed on the strips and the dielectric-filled first trenches. A plurality of dielectric-filled second trenches are formed down to the word lines and extending in a second direction to define a plurality of sacrificial strips comprising the second sacrificial material. The first sacrificial material is removed to define vias and the sacrificial strips are removed to define trenches overlying the vias and extending in the second direction. A plurality of dielectric spacers are formed from the dielectric spacer material. Then a plurality of memory elements and a plurality of bit lines are formed within the vias and trenches.

A memory cell described herein results in the active region within the memory element that can be made extremely small, thus reducing the magnitude of the current needed to induce a phase change. The width of the first portion of memory element within the opening defined by the dielectric spacer is less than that of the diode and the bit line, and preferably less than a minimum feature size for a process, typically a lithographic process, used to form the diodes and word lines of the memory array. The small first portion of the memory element concentrates current density in the first portion of the memory element, thereby reducing the magnitude of the current needed to induce a phase change in the active region. Additionally, the dielectric spacer preferably comprises material providing some thermal isolation to the active region, which also helps to reduce the amount of current necessary to induce a phase change. Furthermore, in embodiments the second portion of the memory element can provide some thermal isolation from the corresponding bit line for the active region.

Memory arrays having fully self-aligned memory cells as described herein result in high density memory. In embodiments the cross-sectional area the memory cells of the array is determined entirely by dimensions of the word lines and bit lines, allowing for a high memory density for array. The word lines have word line widths and adjacent word lines are separated by a word line separation distance, and the bit lines have bit line widths and adjacent bit lines are separated by a bit line separation distance. In preferred embodiments the summation of the word line width and the word line separation distance is equal to twice a feature size F used to form the array, and the summation of the bit line width and the bit line separation distance is equal to twice the feature size F. Additionally, F is preferably a minimum feature size for a process (typically a lithographic process) used to form the bit lines and word lines, such that the memory cells of the array have a memory cell area of $4F^2$.

Other aspects and advantages of the present invention can be seen on review of the drawings, the detailed description and the claims, which follow.

DETAILED DESCRIPTION

Figure 1:
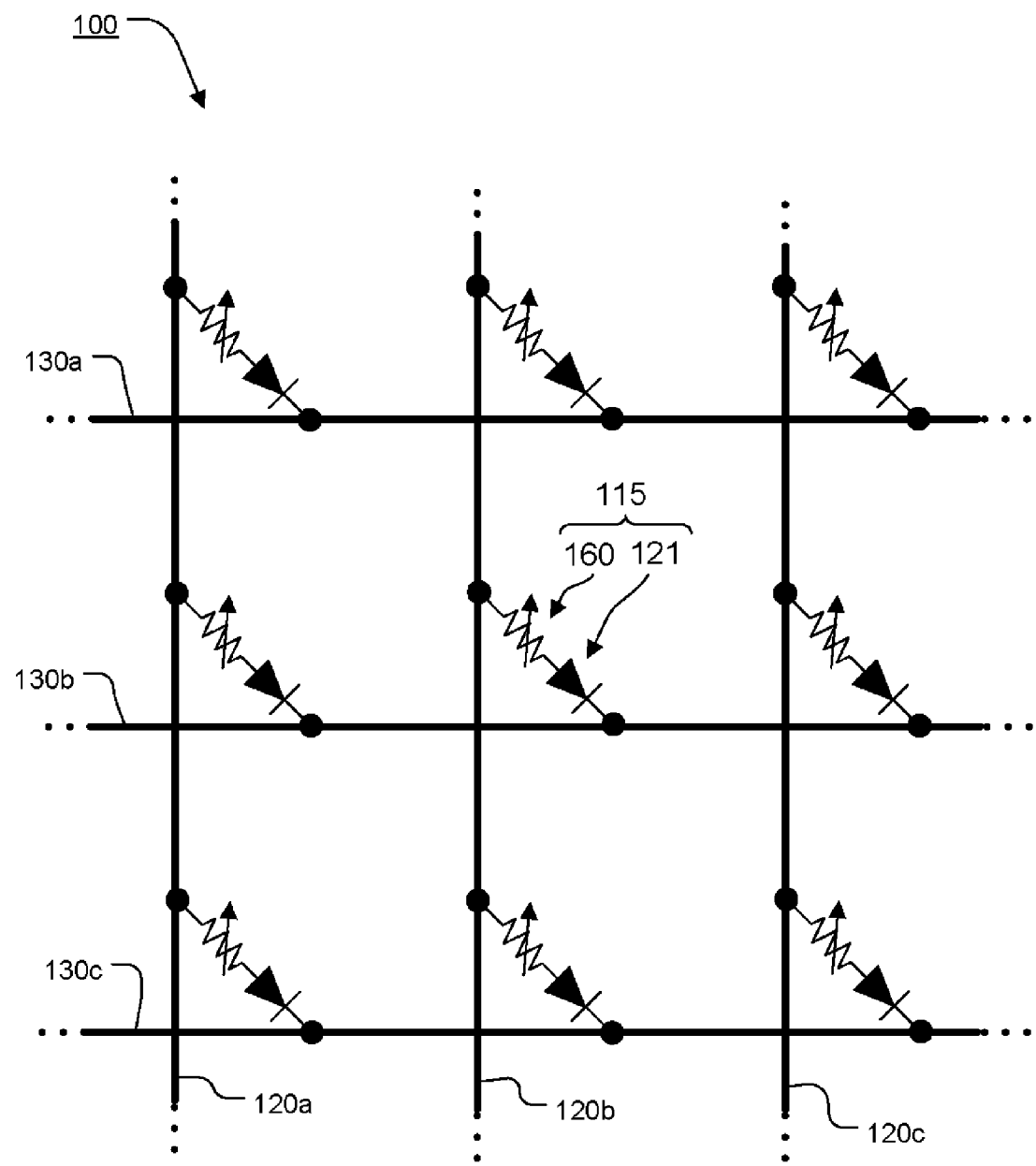
FIG. 1 illustrates a schematic diagram of a portion of a cross-point array implemented using fully self-aligned pore-type memory cells having diode access devices as described herein.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 illustrates a schematic diagram of a portion of a cross-point memory array 100 implemented using fully self-aligned pore-type memory cells having diode access devices as described herein.

As shown in the schematic diagram of FIG. 1, each of the memory cells of array 100 includes a diode access device and a memory element (represented in FIG. 1 by a variable resistor) capable of being set to one of a plurality of resistive states and thus capable of storing one or more bits of data.

The array 100 comprises a plurality of word lines 130 including word lines 130a, 130b, and 130c extending in parallel in a first direction, and a plurality of bit lines 120 including bit lines 120a, 120b, and 120c extending in parallel in a second direction perpendicular to the first direction. The array 100 is referred to as a cross-point array because the word lines 130 and bit lines 120 are arranged in such a manner that a given word line 130 and a given bit line 120 cross over each other but do not physically intersect, and the memory cells are located at these cross-point locations of the word lines 130 and bit lines 120.

Memory cell 115 is representative of the memory cells of array 100 and is arranged at the cross-point location of the bit line 120b and word line 130b, the memory cell 115 comprising a diode 121 and memory element 160 arranged in series, the diode 121 electrically coupled to the word line 130b and the memory element 160 electrically coupled to the bit line 120b.

Reading or writing to memory cell 115 of array 100 can be achieved by applying appropriate voltages and/or currents to the corresponding word line 130b and bit line 120b to induce a current through a selected memory cell 115. The level and duration of the voltages/currents applied is dependent upon the operation performed, e.g. a reading operation or a writing operation.

In a reset (or erase) operation of memory cell 115 having memory element 160 comprising phase change material, a reset pulse is applied to the corresponding word line 130b and bit line 120b to cause a transition of an active region of the phase change material into an amorphous phase, thereby setting the phase change material to a resistance within a resistive value range associated with the reset state. The reset pulse is a relatively high energy pulse, sufficient to raise the temperature of at least the active region of the memory element 160 above the transition (crystallization) temperature of the phase change material and also above the melting temperature to place at least the active region in a liquid state. The reset pulse is then quickly terminated, resulting in a relatively quick quenching time as the active region quickly cools to below the transition temperature so that the active region stabilizes to an amorphous phase.

In a set (or program) operation of memory cell 115 having memory element 160 comprising phase change material, a program pulse is applied to the corresponding word line 130b and bit line 120b of suitable amplitude and duration to induce a current sufficient to raise the temperature of at least a portion of the active region above the transition temperature and cause a transition of a portion of the active region from the amorphous phase into a crystalline phase, this transition lowering the resistance of the memory element 160 and setting the memory cell 115 to the desired state.

In a read (or sense) operation of the data value stored in memory cell 115 having memory element 160 comprising phase change material, a read pulse is applied to the corresponding word line 130b and bit line 120b of suitable amplitude and duration to induce current to flow that does not result in the memory element 160 undergoing a change in resistive state. The current through the memory cell 115 is dependent upon the resistance of the memory element 160 and thus the data value stored in the memory cell 115.

Figure 2A:
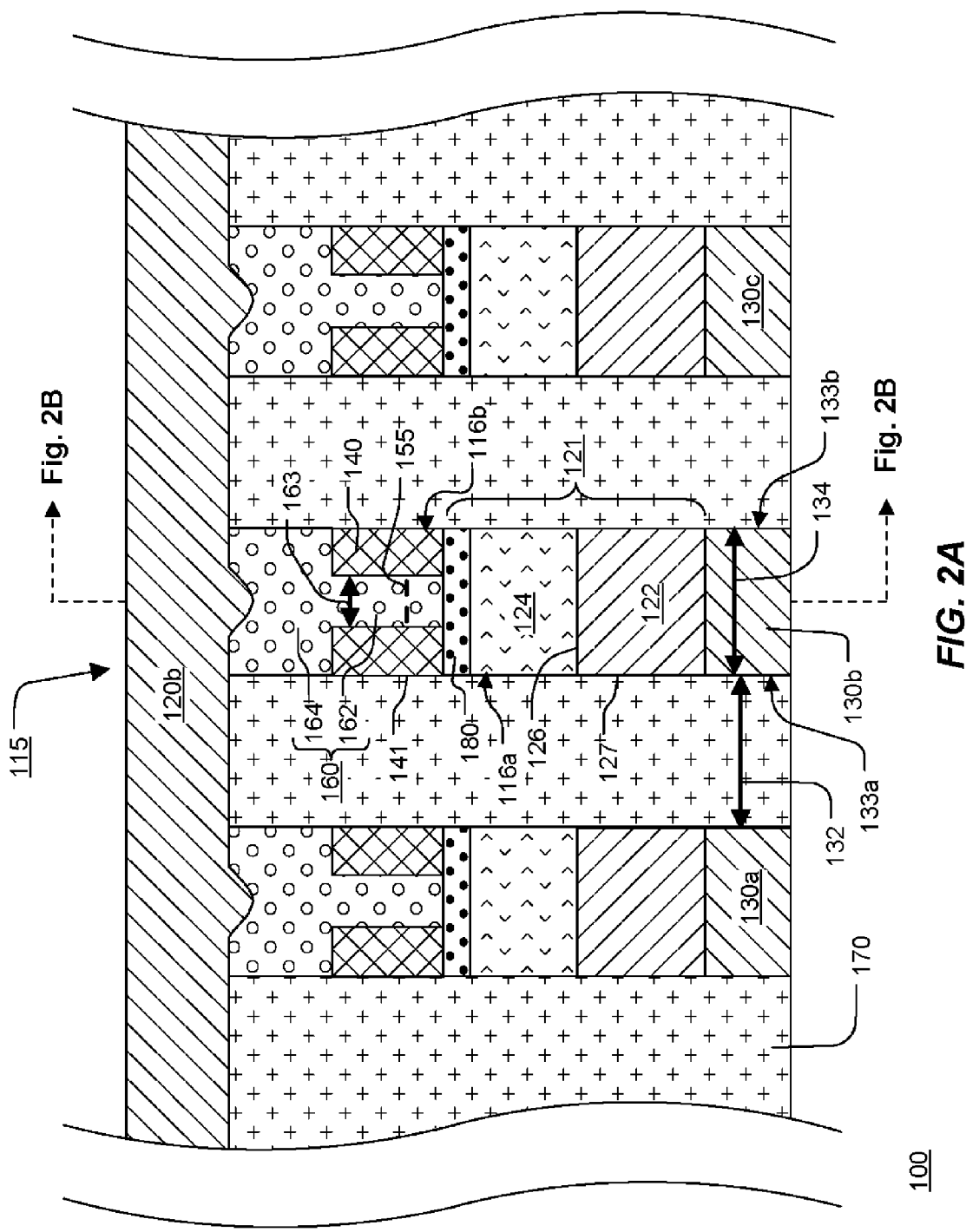
FIGS. 2A-2B illustrate cross-sectional views of memory cells arranged in a cross-point array.
Figure 2B:
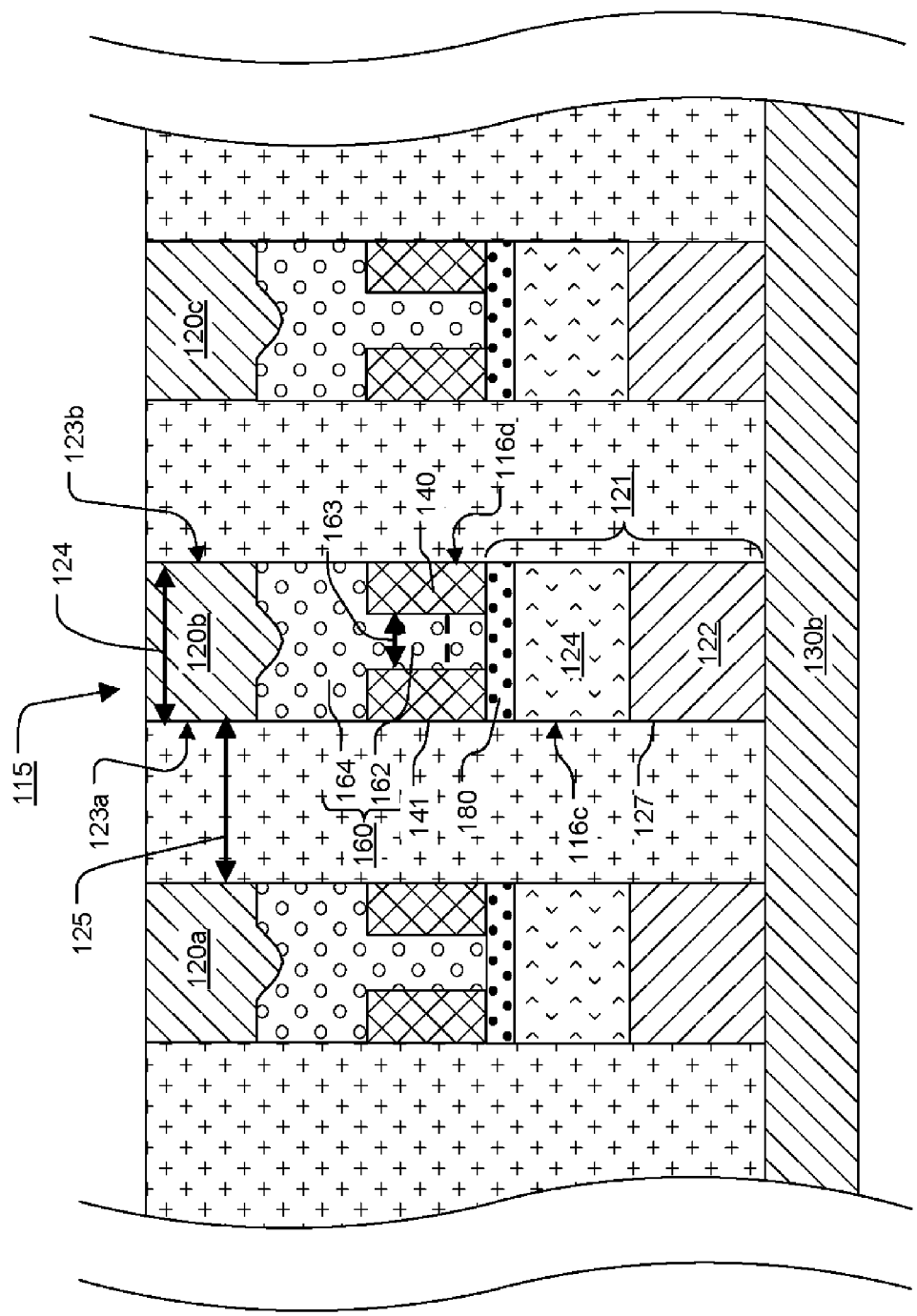

FIGS. 2A and 2B illustrate cross-sectional views of a portion of memory cells (including representative memory cell 115) arranged in the cross-point array 100, FIG. 2A taken along the bit lines 120 and FIG. 2B taken along the word lines 130.

Referring to FIGS. 2A and 2B, the memory cell 115 includes a first doped semiconductor region 122 having a first conductivity type and a second doped semiconductor region 124 on the first doped semiconductor region 122, the second doped semiconductor region 124 having a second conductivity type opposite the first conductivity type. The first doped semiconductor region 122 and the second doped semiconductor region 124 define a pn junction 126 therebetween.

The memory cell 115 includes a conductive cap 180 on the second doped semiconductor region 124. The first and second doped semiconductor regions 122, 124 and the conductive cap 180 comprise a multi-layer structure defining diode 121. In the illustrated embodiment the conductive cap 180 comprises a silicide containing, for example, Ti, W, Co, Ni, or Ta. The conductive cap 180 assists in maintaining the uniformity of an electric field impressed across the first and second doped semiconductor regions 122, 124 during operation by providing a contact surface that is more highly conductive than the semiconductor material of the first and second doped semiconductor regions 122, 124. Additionally, the conductive cap 180 can be used as a protective etch stop layer for the second doped semiconductor region 124 during the manufacturing of the memory cell 100.

The first doped semiconductor region 122 is on word line 130b, the word line 130b extending into and out of the cross-section illustrated in FIG. 2A. In the illustrated embodiment the word lines 130 comprise doped N+ (highly doped N-type) semiconductor material, the first doped semiconductor region 122 comprises doped N− (lightly doped N-type) semiconductor material, and the second doped semiconductor region 124 comprises doped P+ (highly doped P-type) semiconductor material. It has been observed that the breakdown voltage of diode 121 comprising can be increased by increasing the distance between the P+ doped region and the N+ doped region and/or decreasing the doping concentration in the N− region.

In an alternative embodiment the word lines 130 may comprise other conductive materials such as W, TiN, TaN, Al. In yet another alternative embodiment the first doped semiconductor region 122 may be omitted and the diode 121 formed from the second doped semiconductor region 124, the conductive cap 180 and a portion of word line 130b.

Memory element 160 is on a dielectric spacer 140 and electrically couples the diode 121 to the corresponding bit line 120b. The memory element 160 comprises memory material, for example, one or more materials from the group consisting of Ge, Sb, Te, Se, In, Ti, Ga, Bi, Sn, Cu, Pd, Pb, Ag, S, Si, O, P, As, N and Au. The memory element 160 comprises a first portion 162 within an opening defined by the dielectric spacer 140 on the diode 121 to contact a top surface of the diode 121, the first portion 262 being surrounded by the dielectric spacer 140. The memory element 160 also includes a second portion 164 on the first portion 162.

The dielectric spacer 140 preferably comprises material resistive to diffusion of the memory material of memory element 160. In some embodiments the material of dielectric spacer 140 is chosen for low thermal conductivity for reasons discussed in more detail below. The dielectric spacer 140 has sides 141 self-aligned with sides 127 of the diode 121. In the manufacturing embodiment described in more detail below with reference to FIGS. 3-16, material of the dielectric spacer 140 is patterned during patterning of material of the diode 121.

The bit lines 120, including bit line 120b acting as a top electrode for the memory cell 115, extend into and out of the cross-section illustrated in FIG. 2B. The bit lines 120 may comprise one or more layers of conductive material. The bit lines 120 may comprise, for example, TiN or TaN. TiN may be preferred in embodiments in which the memory element 160 comprises GST (discussed below) because it makes good contact with GST, it is a common material used in semiconductor manufacturing, and it provides a good diffusion barrier. Alternatively, the bit lines 120 may be TiAlN or TaAlN, or comprises, for further examples, one or more elements selected from the group consisting of Ti, W, Mo, Al, Ta, Cu, Pt, Ir, La, Ni, N, O, and Ru and combinations thereof.

Dielectric 170, comprising one or more layers of dielectric material, surrounds the memory cells and separates adjacent word lines 130 and adjacent bit lines 120.

In operation, voltages on the word line 130b and bit line 120b can induce a current through the memory element 160 and the diode 121.

The active region 155 is the region of the memory element 160 in which the memory material is induced to change between at least two solid phases. As can be appreciated, the active region 155 can be made extremely small in the illustrated structure, thus reducing the magnitude of the current needed to induce a phase change. The width 163 of the first portion 162 of memory element 160 is less than that of the diode 121 and the second portion 164 of the memory element 160, and preferably less than a minimum feature size for a process, typically a lithographic process, used to form the diodes 121 and word lines 130 of the memory array 100. The small first portion 162 of the memory element 160 concentrates current density in the first portion 162 of the memory element 160, thereby reducing the magnitude of the current needed to induce a phase change in the active region 155. Additionally, the dielectric spacer 140 preferably comprises material providing some thermal isolation to the active region 155, which also helps to reduce the amount of current necessary to induce a phase change. Furthermore, the second portion 164 of the memory element 160 can provide some thermal isolation from the corresponding bit line 120 for the active region 155.

As can be seen in the cross-sections illustrated in FIG. 2A and FIG. 2B, the memory cells of the array 100 are arranged at the cross-point locations of the word lines 130 and bit lines 120. Memory cell 115 is representative and is arranged at the cross-point location of word line 130b and bit line 120b. The diode 121, dielectric spacer 140, and memory element 160 form a structure for memory cell 115, the structure having a first width substantially the same as the width 134 of the word lines 130 (See FIG. 2A). Furthermore, the structure has a second width substantially the same as the width of the bit lines 120 (See FIG. 2B). As used herein, the term "substantially" is intended to accommodate manufacturing tolerances. Therefore, the cross-sectional area of the memory cells of array 100 is determined entirely by dimensions of the word lines 130 and bit lines 120, allowing for a high memory density for array 100.

The word lines 130 have word line widths 134 and adjacent word lines 130 are separated by a word line separation distance 132 (See FIG. 2A), and the bit lines 120 have bit line widths 124 and adjacent bit lines 120 are separated by a bit line separation distance 125 (See FIG. 2B). In preferred embodiments the summation of the word line width 134 and the word line separation distance 132 is equal to twice a feature size F used to form the array 100, and the summation of the bit line width and the bit line separation distance 125 is equal to twice the feature size F. Additionally, F is preferably a minimum feature size for a process (typically a lithographic process) used to form the bit lines 120 and word lines 130, such that the memory cells of array 100 have a memory cell area of $4F^2$.

In the memory array 100 illustrated in FIGS. 2A-2B, the structure of memory cell 115 formed by the diode 121, dielectric spacer 140, and memory element 160 has first and second sides 116a, 116b self-aligned with the sides 133a, 133b of the corresponding word line 130b and has third and fourth sides 116c, 116d self-aligned with the sides 123a, 123b of the corresponding bit line 120b. In the manufacturing embodiment described in more detail below with respect to FIGS. 3-16, the diode 121 is formed during the formation of the word lines 130 and the patterning of material which defines the locations of the dielectric spacer 140, the memory element 160 and the bit lines 120. Thus, the memory cells in the array 100 illustrated in the cross-sectional views of FIGS. 2A-2B are fully self-aligned.

FIGS. 3-16 illustrate steps in a fabrication sequence for manufacturing the cross point array 100 of memory cells as illustrated in FIGS. 2A-2B.

Figure 3A:
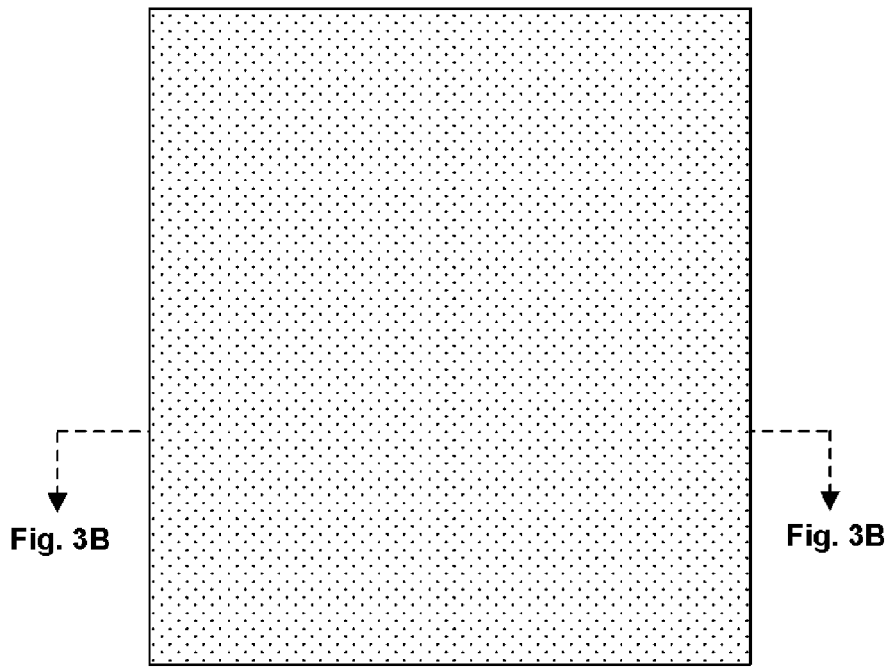
FIGS. 3-16 illustrate steps in a fabrication sequence for manufacturing the cross-point array of memory cells as illustrated in FIGS. 2A-2B.
Figure 3B:
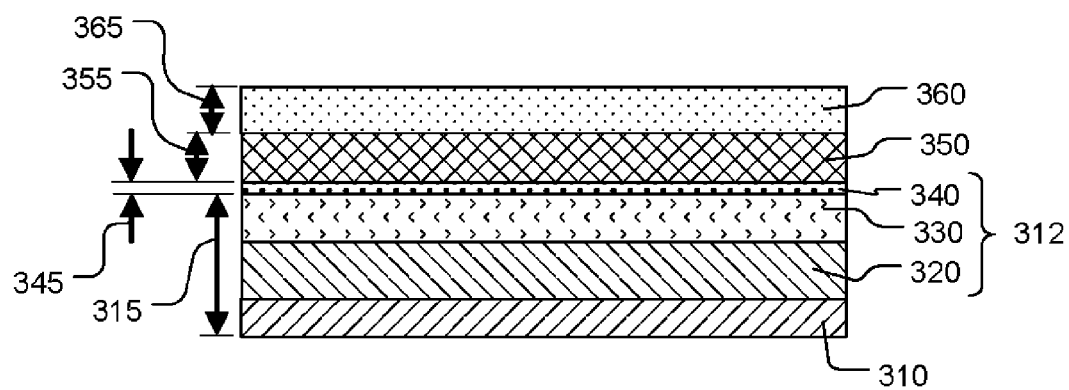

FIGS. 3A-3B illustrate top and cross-sectional views of a first step of forming a structure 300 on a P-well. The multilayer structure 300 includes a word line material 310 and a diode material 312 on the word line material 310.

The diode material 312 comprises a first doped semiconductor material layer 320, a second doped semiconductor material layer 330, and a conductive cap material layer 340 on the second doped semiconductor material layer 330.

In the illustrated embodiment the word line material 310 comprises doped N+ (highly doped N-type) semiconductor material, the first doped semiconductor material layer 320 comprises doped N− (lightly doped N-type) semiconductor material, and the second doped semiconductor material 330 comprises doped P+ (highly doped P-type) semiconductor material. The layers 310, 320, 330 may be formed by implantation and activation annealing processes as known in the art.

In the illustrated embodiment the conductive cap material layer 340 comprises a silicide containing, for example, Ti, W, Co, Ni, or Ta. In one embodiment the layer 340 comprises cobalt silicide (CoSi) and is formed by depositing a layer of cobalt and performing a rapid thermal process (RTP) such that the cobalt reacts with the silicon of layer 330 to form the layer 340. It is understood that other silicides may also be formed in this manner by depositing titanium, arsenic, doped nickel, or alloys thereof, in a manner similar to the example described herein using cobalt.

A dielectric spacer material 350 is on the diode material 312, and a sacrificial element material 360 is on the dielectric spacer material 350. The layers 350, 360 preferably comprise material which can be selectively processed (e.g. selectively etched) relative to one another. In the illustrated embodiment the dielectric spacer material 350 comprises SiN and the sacrificial element material 360 comprises amorphous silicon.

In the illustrated embodiment the layers 310, 320, and 330 have a total thickness 315 of about 400 nm, layer 340 has a thickness 345 of about 50 nm, layer 350 has a thickness 355 of about 40 nm, and layer 360 has a thickness 365 of about 90 nm.

Figure 4A:
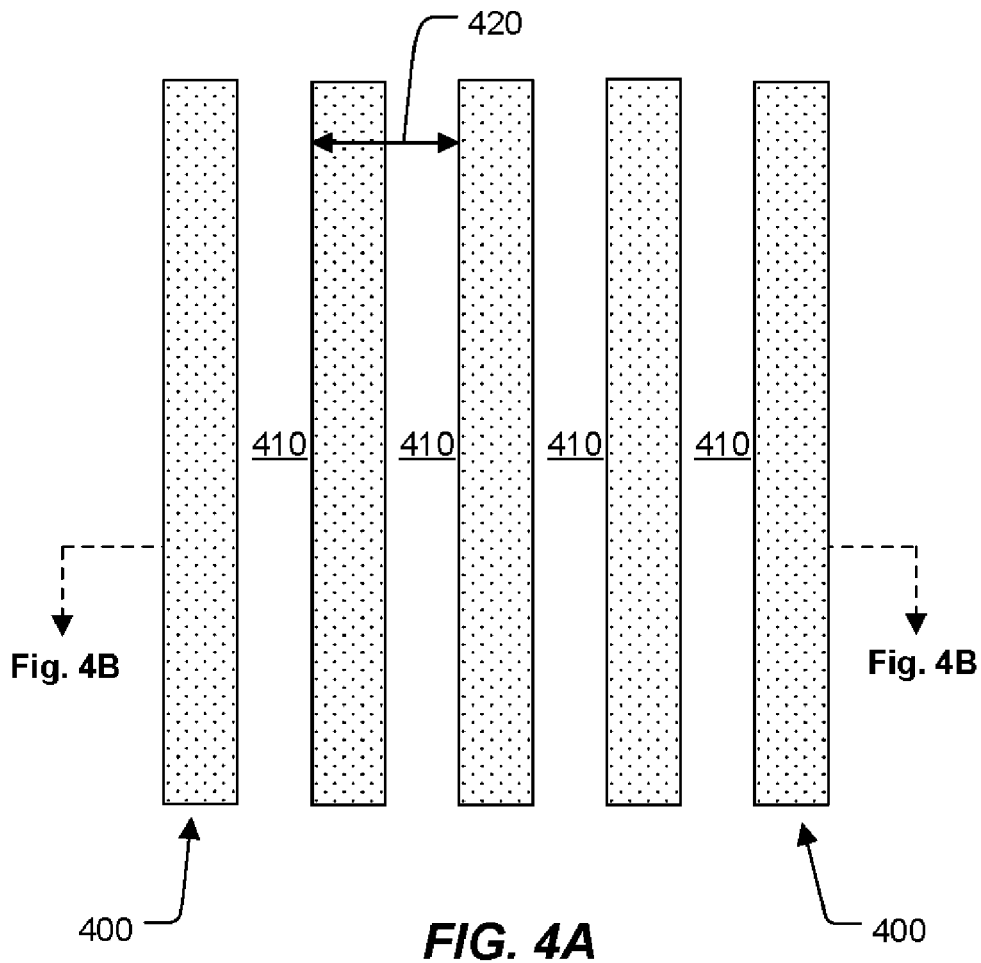
Figure 4B:
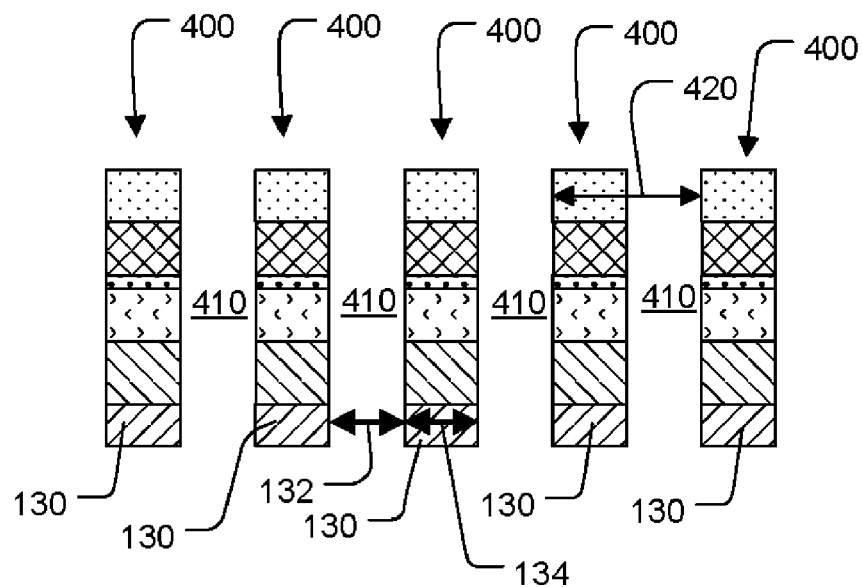

Next, the structure 300 is patterned to form a plurality of first trenches 410 extending in a first direction to define a plurality of strips 400, each strip 400 including word lines 130 comprising word line material of layer 310, resulting in the structure illustrated in top and cross-sectional views of FIGS. 4A and 4B respectively. The word lines 130 have width 134 and separation distance 132, each preferably equal to the minimum feature size of a process, such as a lithographic process, used to form the first trenches 410. In the illustrated embodiment the multi-layer strips 400 have a pitch 420 of about 250 nm.

Figure 5A:
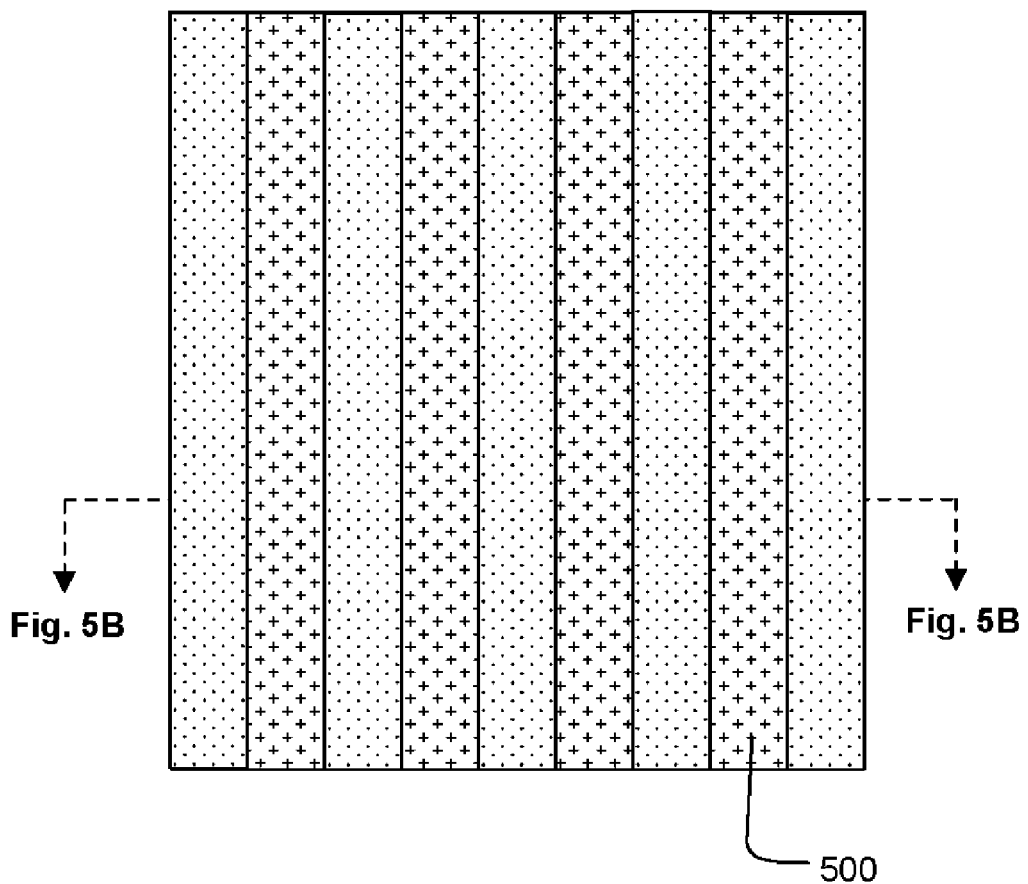
Figure 5B:
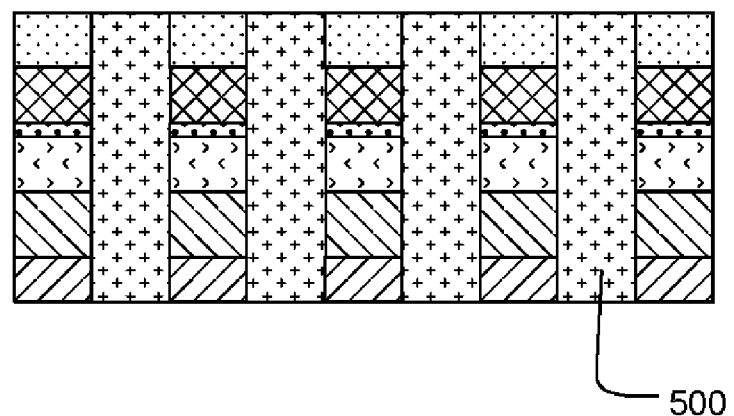

Next, the trenches 410 of the structure illustrated in FIGS. 4A-4B are filled with a dielectric fill material 500, resulting in the structure illustrated in the top and cross-sectional views of FIGS. 5A and 5B respectively. The dielectric fill material 500 may comprise, for example silicon dioxide, and may be formed by depositing the material 500 within the trenches 410 and then performing a planarizing process such as chemical mechanical polishing CMP.

Figure 6A:
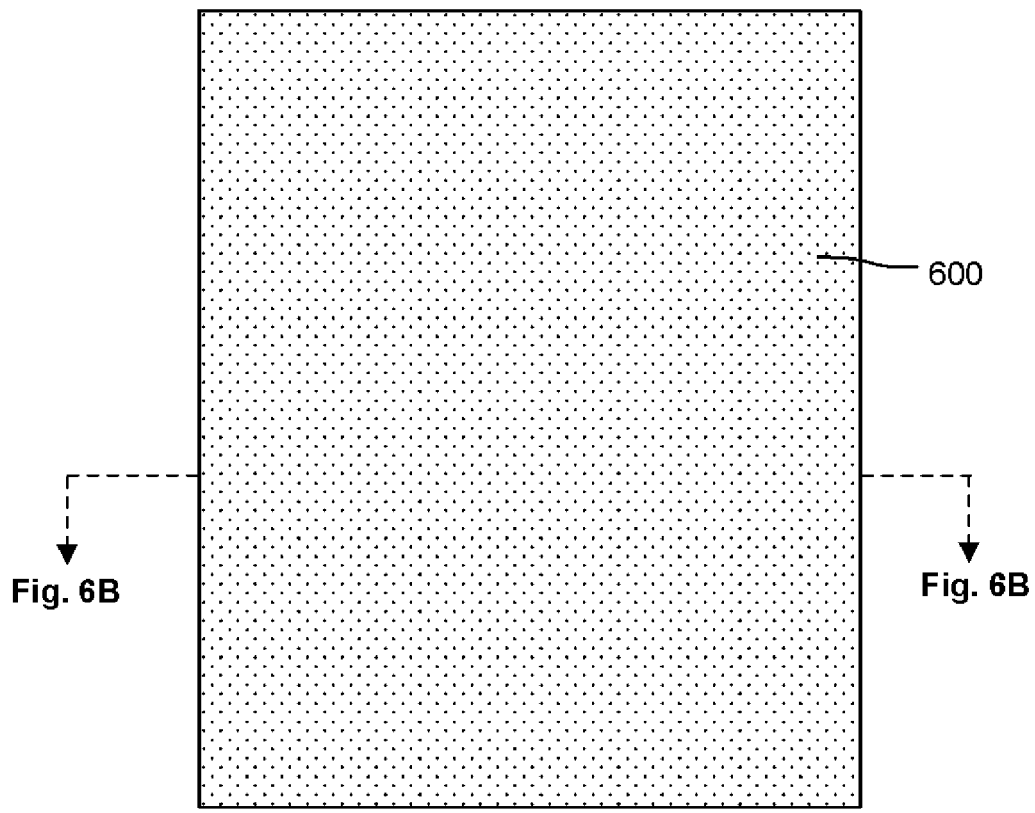
Figure 6B:
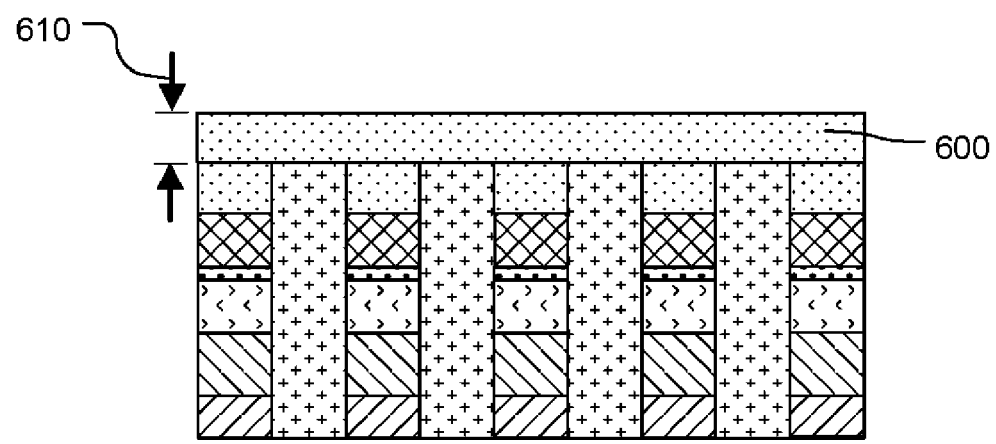

Next, a sacrificial strip material 600 is formed on the structure illustrated in FIGS. 5A-5B, resulting in the structure illustrated in the top and cross-sectional of FIGS. 6A and 6B respectively. In the illustrated embodiment the second sacrificial material 600 comprises a layer amorphous silicon deposited having a thickness of about 90 nm.

Figure 7A:
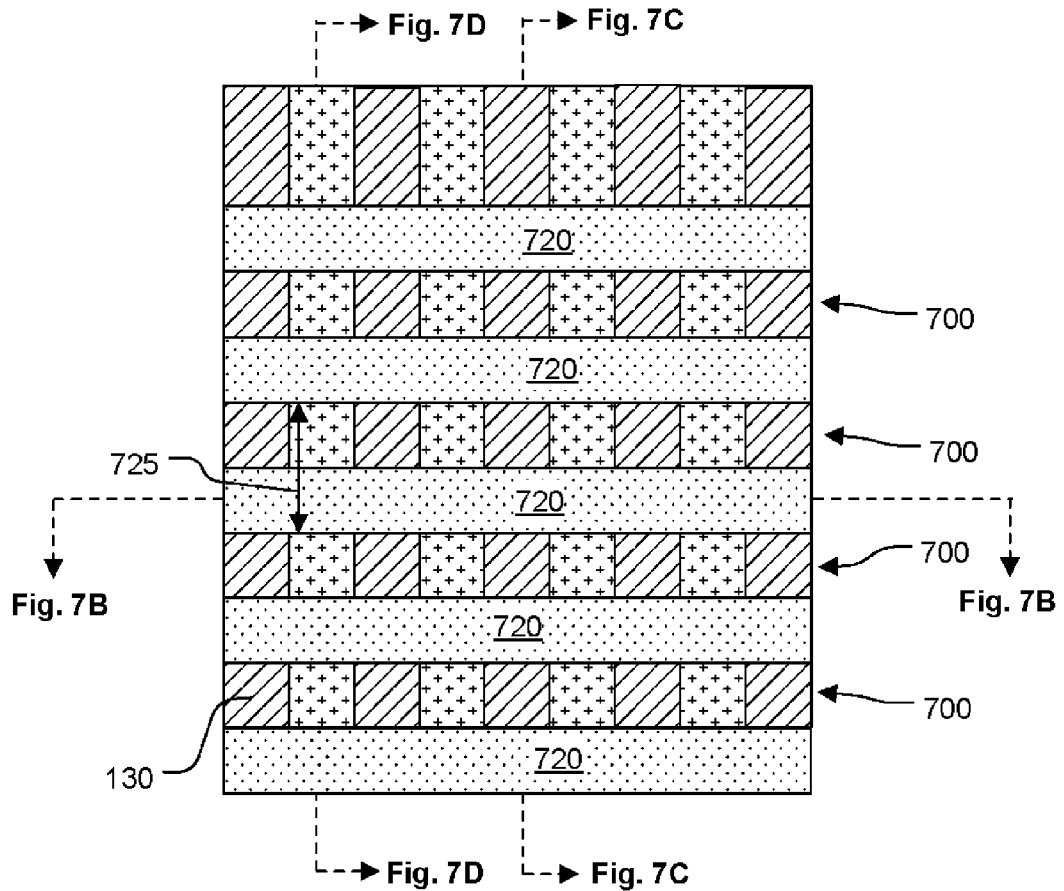
Figure 7B:
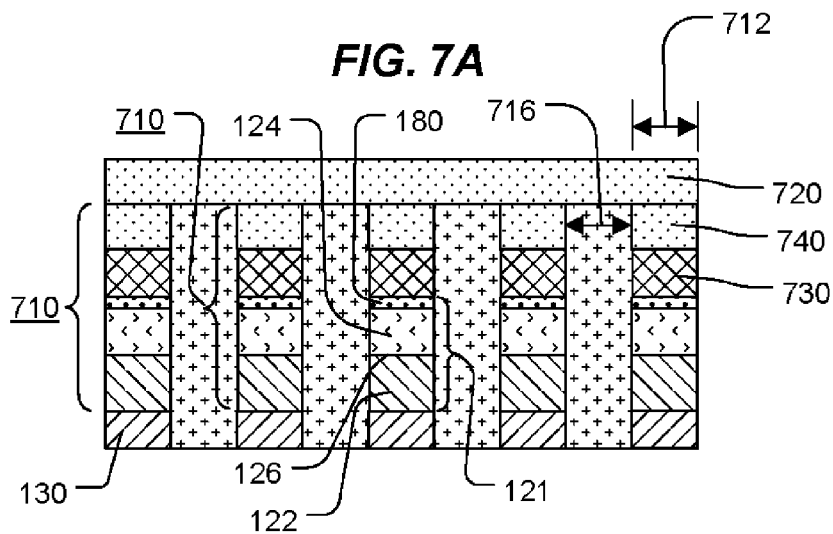
Figure 7C:
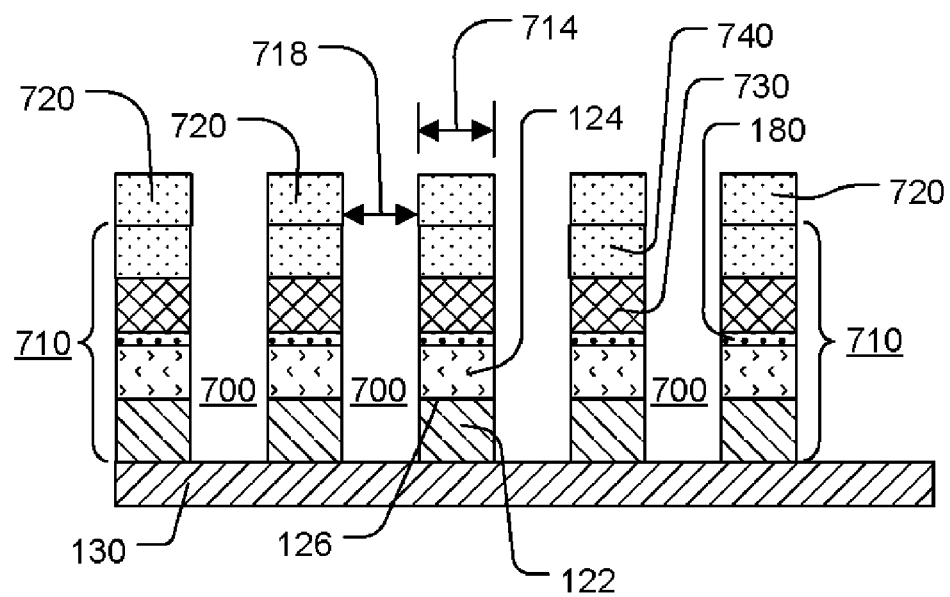
Figure 7D:
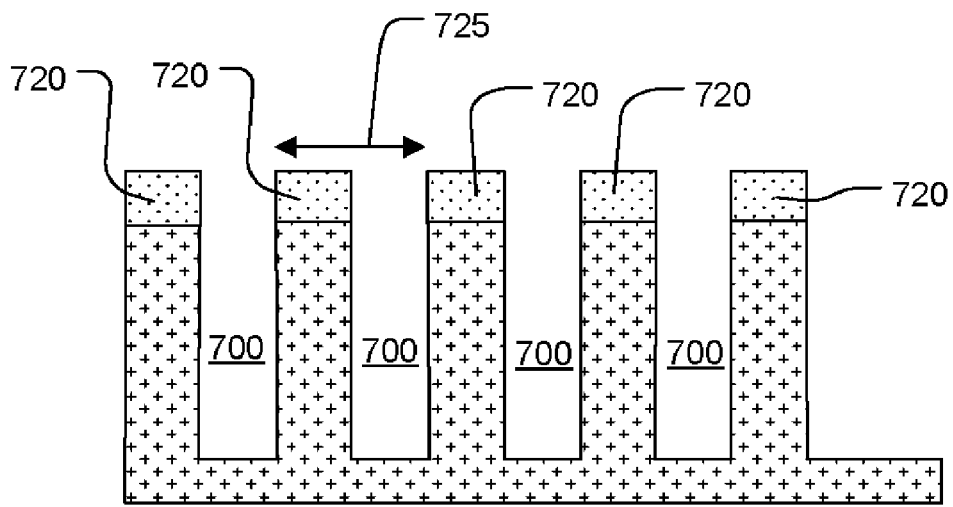

Next, the structure illustrated in FIGS. 6A-6B is patterned to form a plurality of second trenches 700 extending in parallel in a second direction to define a plurality of stacks 710 and sacrificial strips 720 comprising sacrificial strip material of layer 600, resulting in the structure illustrated in the top view of FIG. 7A and the cross-sectional views of FIGS. 7B-7D respectively. In the illustrated embodiment the strips 720 have a pitch 725 of about 250 nm.

The trenches 700 can be formed by patterning a layer of photoresist on the structure illustrated in FIGS. 6A-6B, and etching down to the word lines 130 using the patterned photoresist as an etch mask.

As can be seen in the cross-sectional views of FIGS. 7B and 7C, each of the stacks 710 includes a diode 121 comprising diode material 312 on the corresponding word line 130, a dielectric element 730 comprising material of layer 350 on the diode 121, and a sacrificial element 740 comprising material of layer 360 on the dielectric element 730.

The diodes 121 include a first doped semiconductor region 122 comprising material from layer 320, a second doped semiconductor region 124 comprising material from layer 330, and a conductive cap 180 comprising material from layer 340. The first doped semiconductor region 122 and the second doped semiconductor region 124 define a pn junction 126 therebetween.

Due to the formation of the first trenches 410 of FIGS. 4A-4B to form strips 400 including word lines 130 and the subsequent formation of the second trenches 700 of FIGS. 7A-7D, the multi-layer stacks 710 are self-aligned to the corresponding underlying word lines 130 and the corresponding overlying sacrificial strips 720. Additionally, the stacks 710 have widths 712, 714 and separation distances 716, 718 both preferably equal to the minimum feature size of the process (typically a lithographic process) used to form the trenches 410 and 700.

Figure 8A:
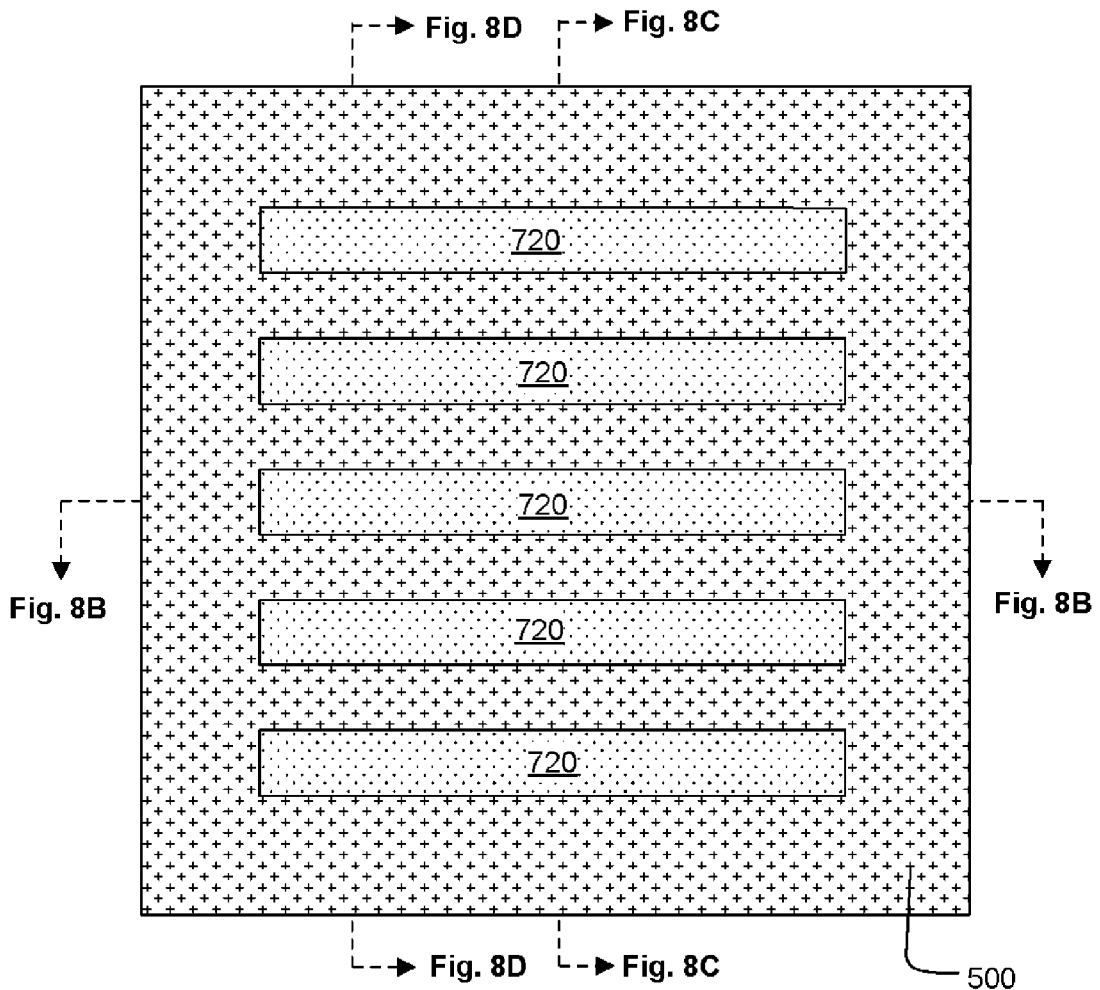
Figure 8B:
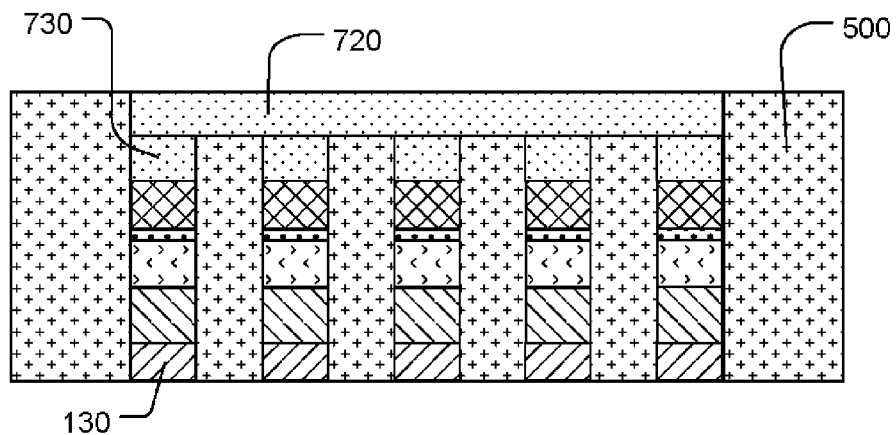
Figure 8C:
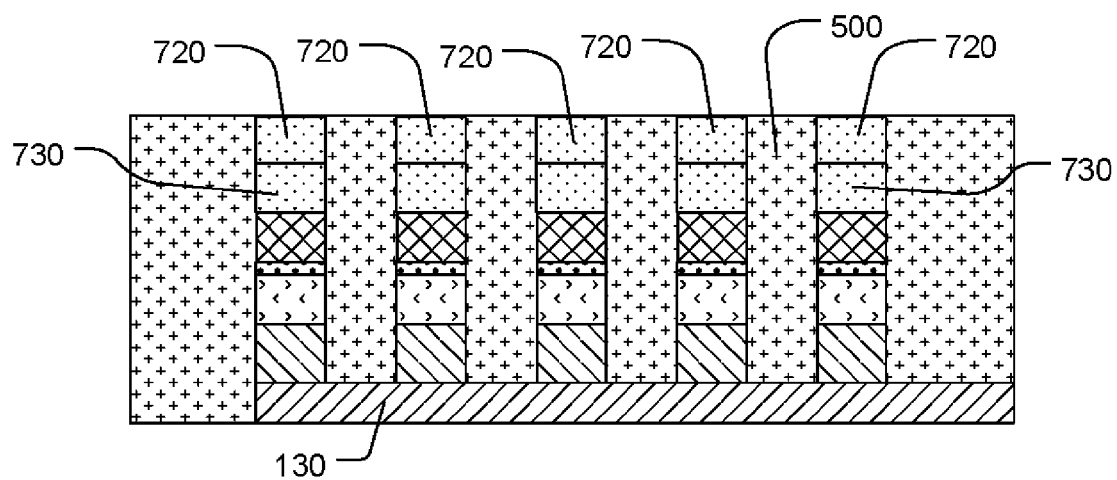
Figure 8D:
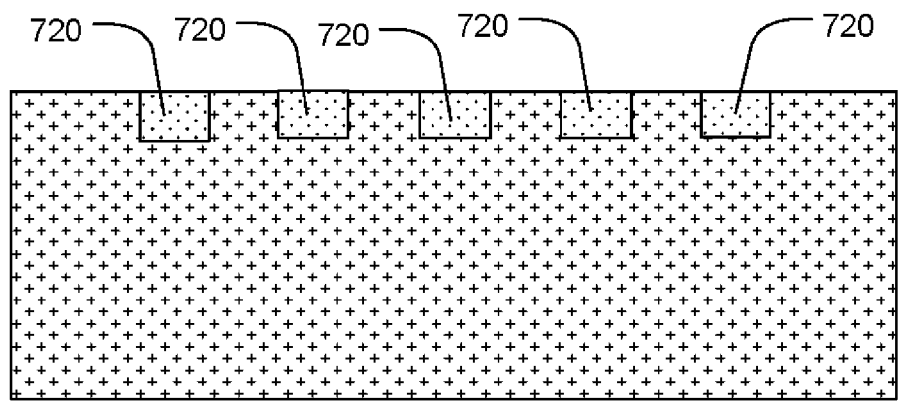

Next, the trenches 700 of the structure illustrated in FIGS. 7A-7D are filled with additional dielectric fill material 500, resulting in the structure illustrated in the top view of FIG. 8A and the cross-sectional views of FIGS. 8B-8D respectively. In the illustrated embodiment the trenches 700 are filled with the same material as that of the dielectric 500 used to fill the trenches 410 as described above with reference to FIGS. 5A-5B. The dielectric fill material 500 may be formed by depositing the material within the trenches 700 and then performing a planarizing process such as chemical mechanical polishing CMP to expose the top surfaces of the sacrificial strips 720.

Figure 9A:
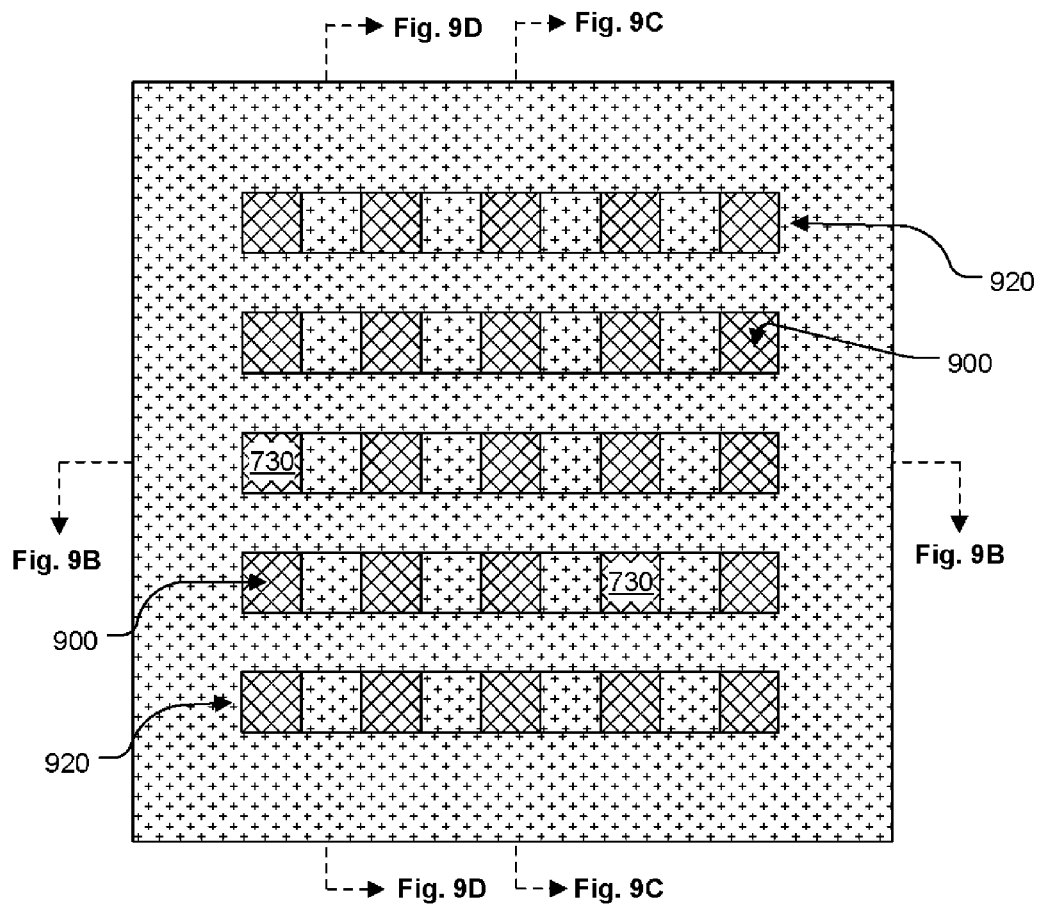
Figure 9B:
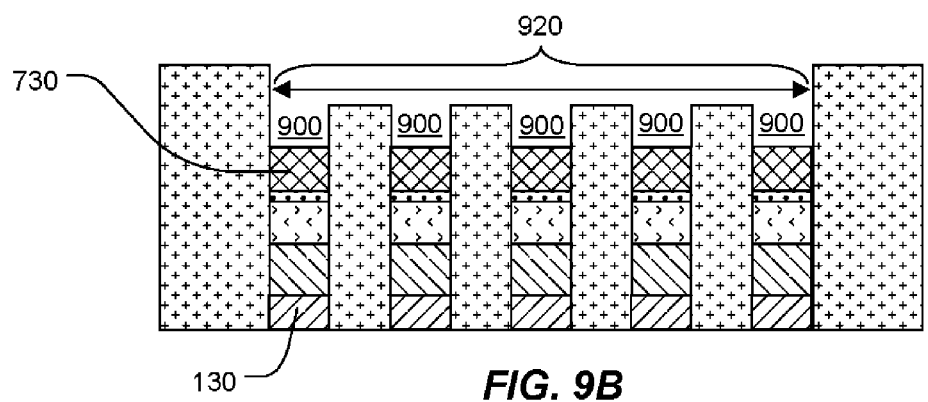
Figure 9C:
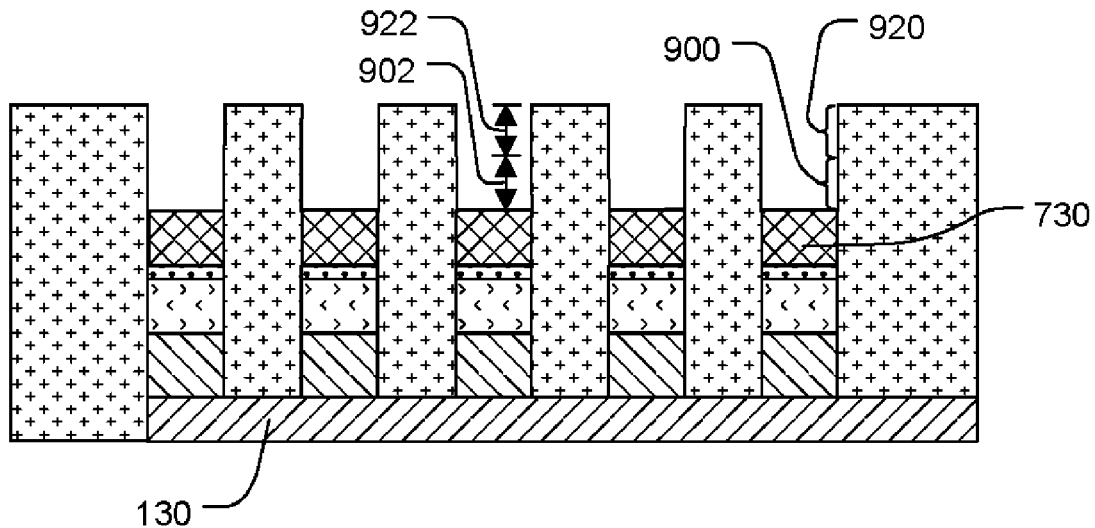
Figure 9D:
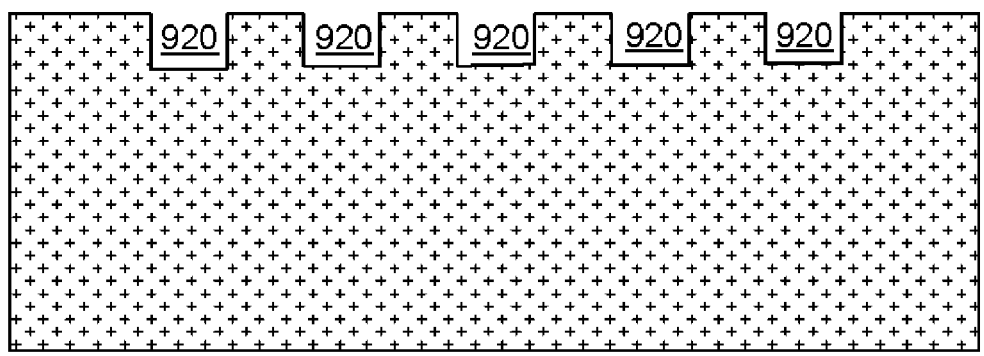

Next, the sacrificial strips 720 and the sacrificial elements 730 are removed to form vias 900 at the locations of the elements 730 and trenches 920 at the locations of the strips 720, resulting in the structure illustrated in the illustrated in the top view of FIG. 9A and the cross-sectional views of FIGS. 9B-9D. In the illustrated embodiment the sacrificial strips 720 and the sacrificial elements 730 both comprise amorphous silicon and may be removed by etching using, for example, KOH or tetramethylammonium hydroxide (THMA). In the illustrated embodiment the vias 900 have a height 902 of about 90 nm, and the trenches 920 have a height 922 of about 90 nm.

Figure 10A:
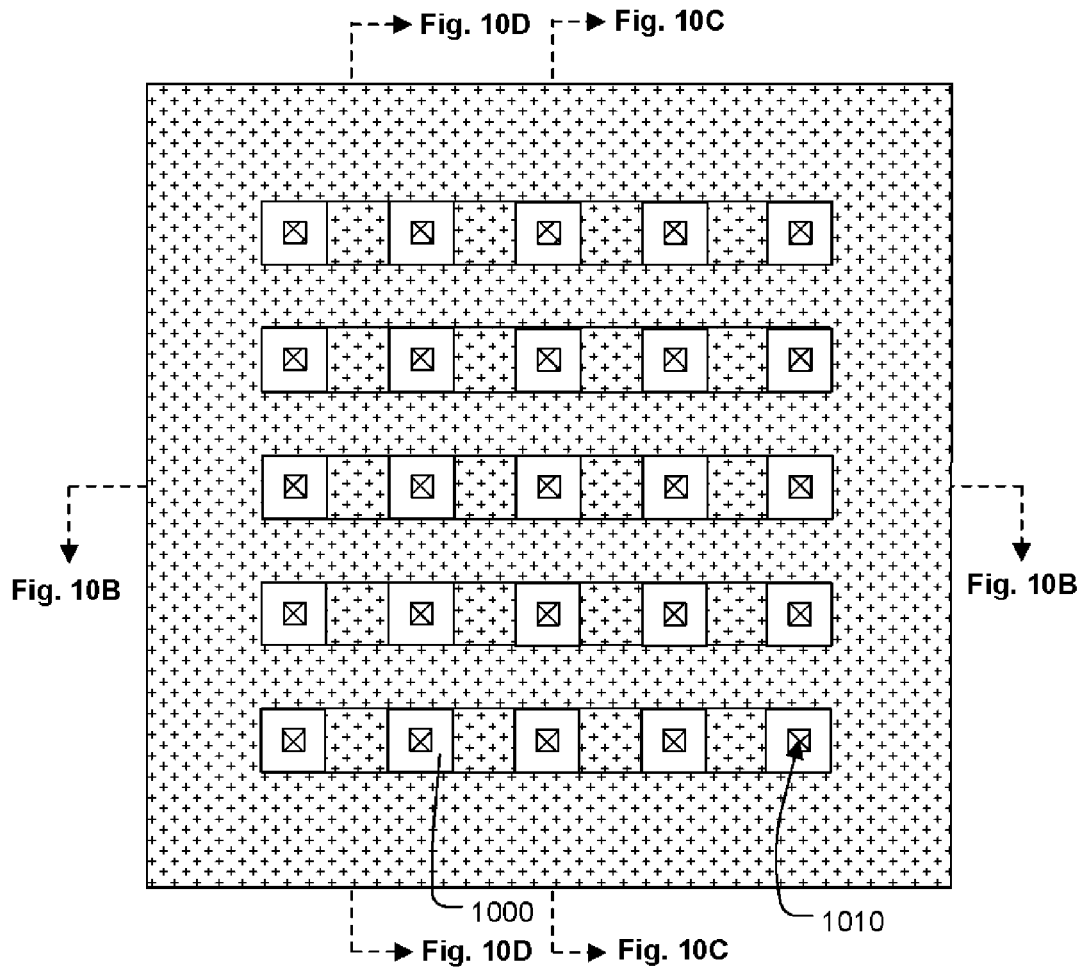
Figure 10B:
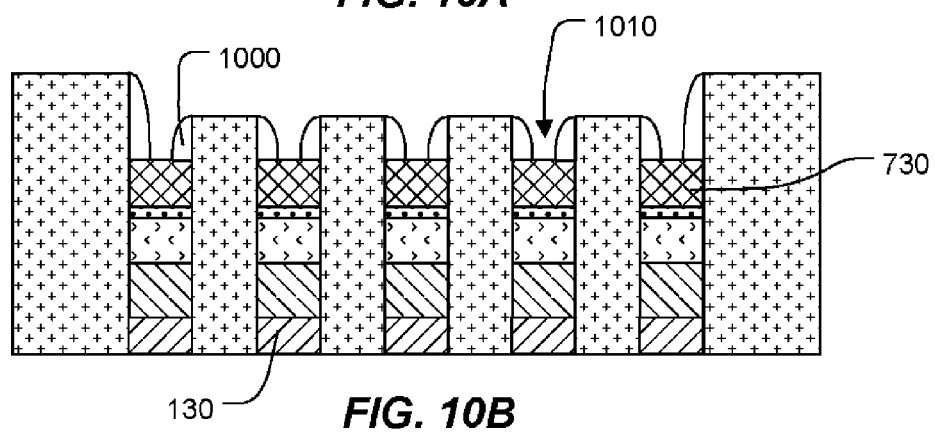
Figure 10C:
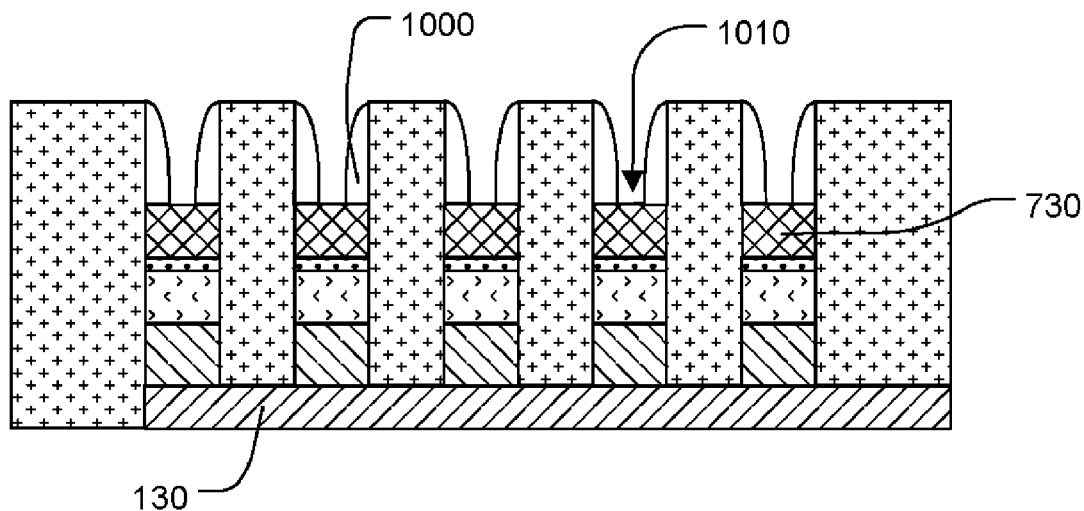
Figure 10D:
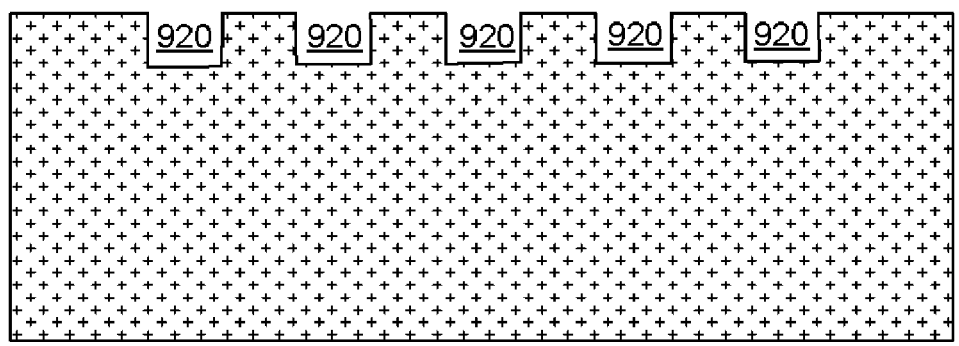

Next, sidewall spacers 1000 are formed within the vias 900 of FIGS. 9A-9D, resulting in the structure illustrated in the top view of FIG. 10A and the cross-sectional views of FIGS. 10B-10D. The sidewall spacers 1000 define openings 1010 within the vias 900, and in the illustrated embodiment the sidewall spacers 1000 comprise silicon.

The sidewall spacers 1000 may be formed by forming a sidewall spacer material layer on the structure illustrated in FIGS. 9A-9D, and anisotropically etching the sidewall spacer material layer to expose a portion of the dielectric elements 730. In such an embodiment the openings 1010 of the sidewall spacers 1000 are self-centered within the sidewall spacers 1000.

In the illustrated embodiment the sidewall spacers 1000 define openings 1010 having a square-like cross-section. However, in embodiments the openings 1010 may have a cross-section that is circular, elliptical, rectangular or somewhat irregularly shaped, depending on the manufacturing technique applied to form the sidewall spacers 1000.

Figure 11A:
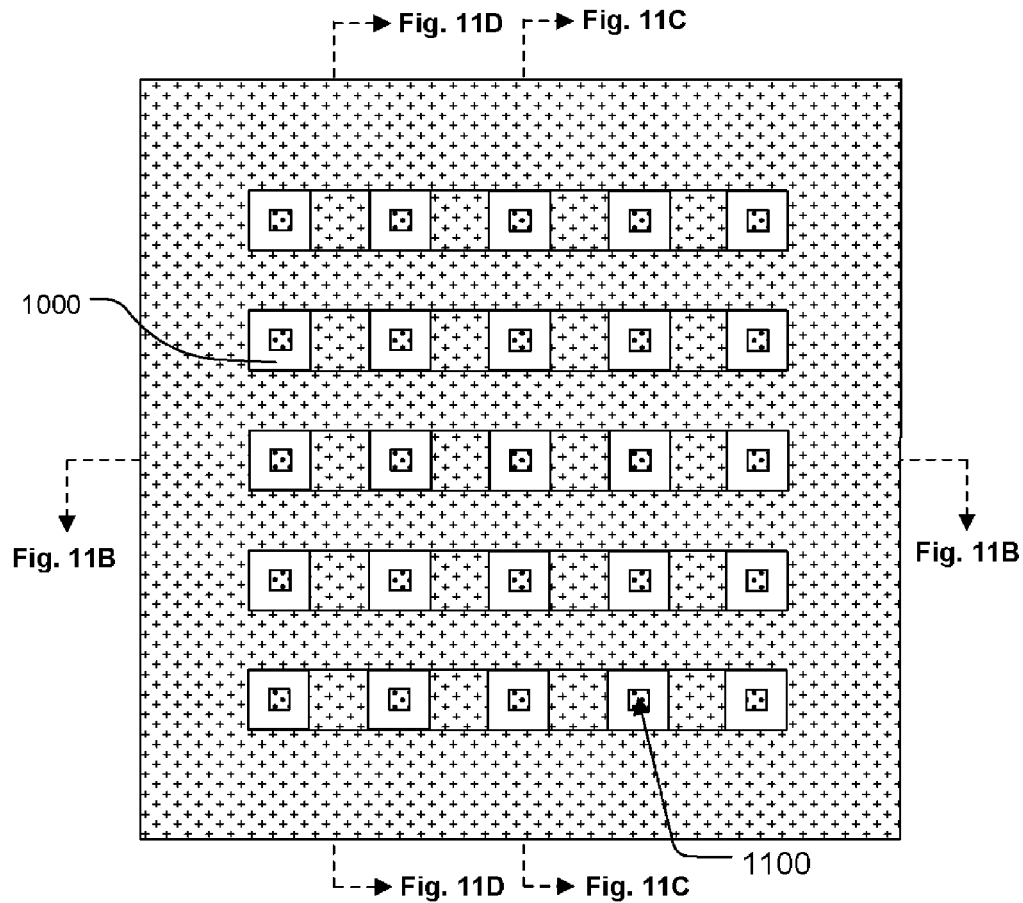
Figure 11B:
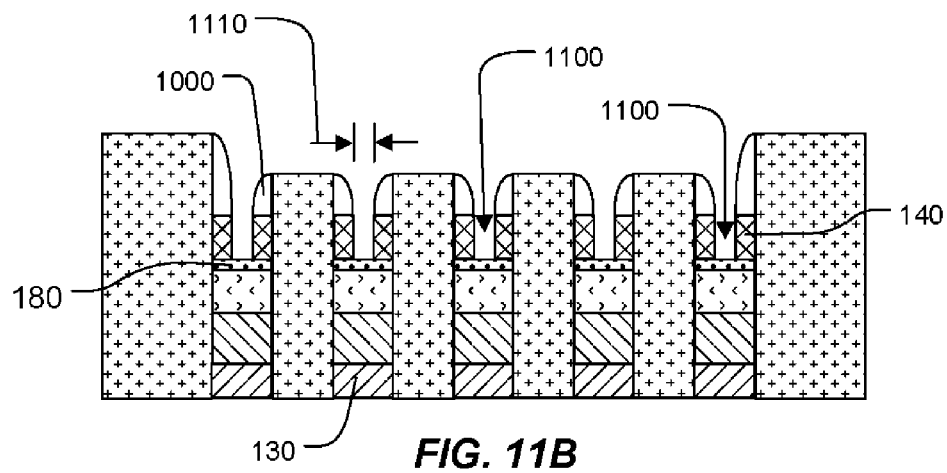
Figure 11C:
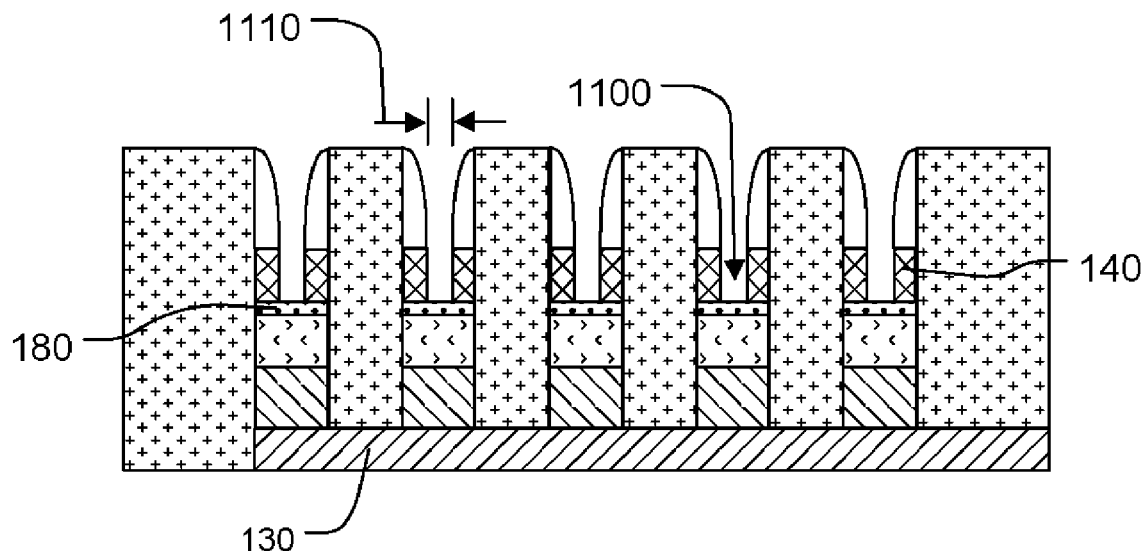
Figure 11D:
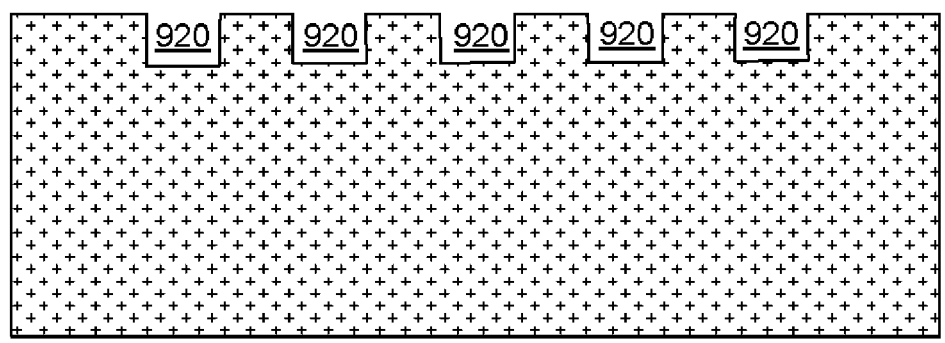

Next, the dielectric elements 730 are etched using the sidewall spacers 1000 as an etch mask, thereby forming dielectric spacers 140 and resulting in the structure illustrated in the top view of FIG. 11A and the cross-sectional views of FIGS. 11B-11D. The etching can be performed, for example, using Reactive Ion Etching RIE.

As can be seen in the FIGS. 11A-11D the dielectric spacers 140 have openings 1100 extending to the conductive caps 180, the conductive caps 180 acting as an etch stop layer during the formation of the dielectric spacers 140. The openings 1100 have a width 1110 which can be sublithographic, and in the illustrated embodiment the width 1110 is about 40 nm. As described above the openings 1010 of the sidewall spacers 1000 can be self-centered, and thus it will be understood that the formation of the openings 1100 of the dielectric spacers 140 can also be self-centered.

Figure 12A:
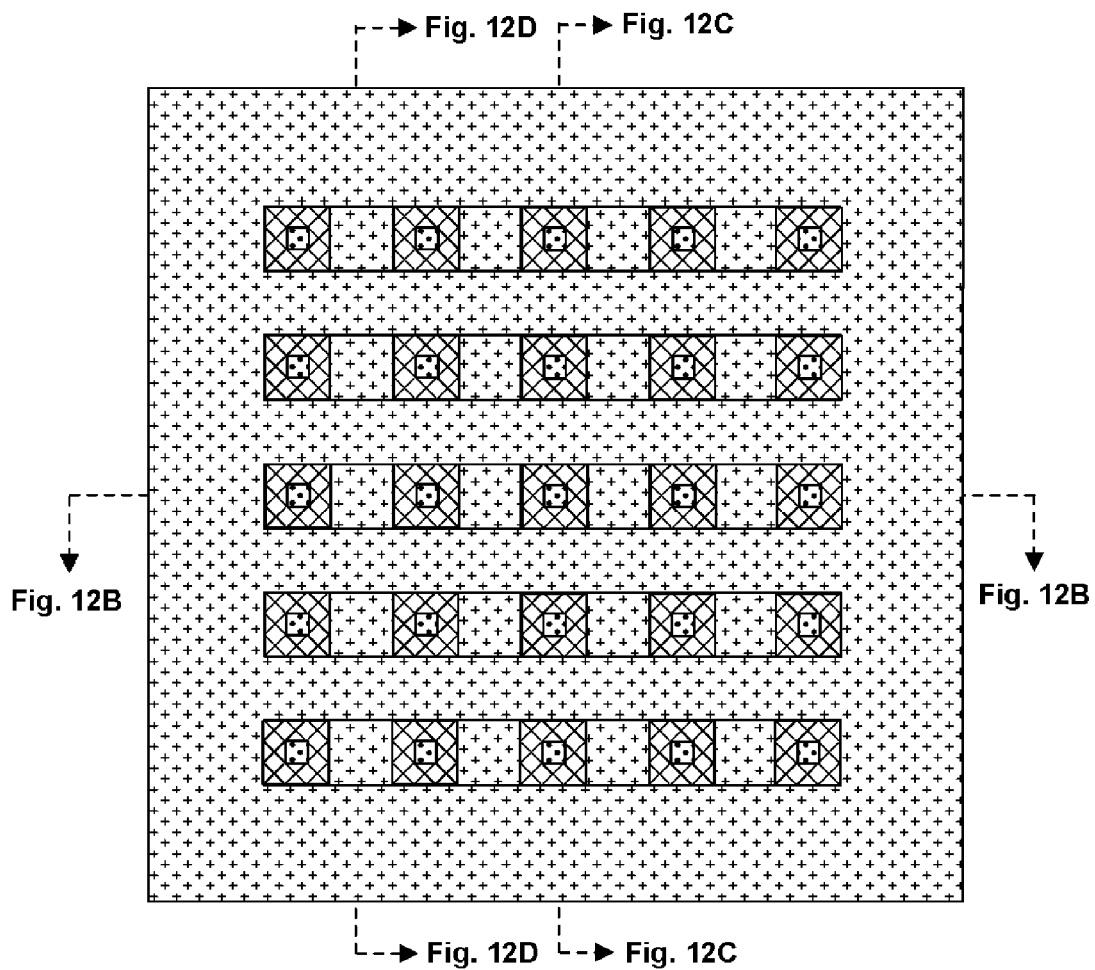
Figure 12B:
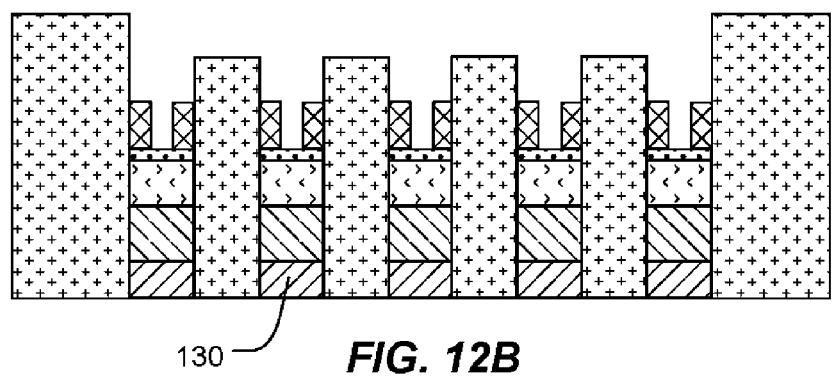
Figure 12C:
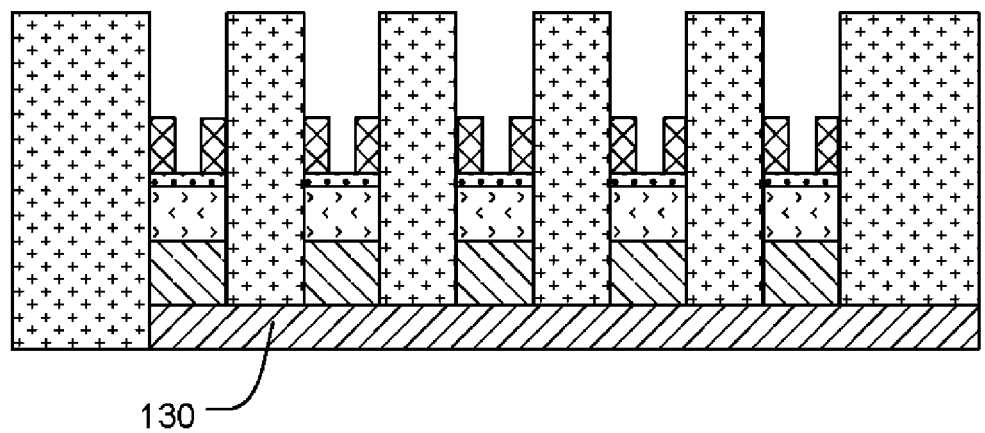
Figure 12D:
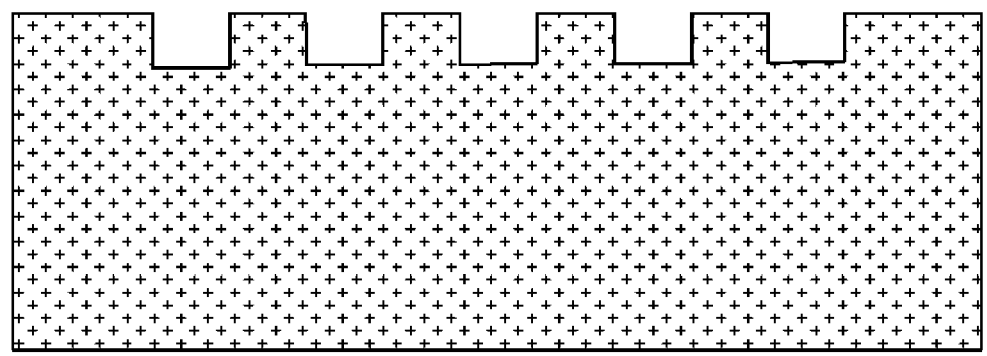

Next, the sidewall spacers 1000 are removed from the structure illustrated in FIGS. 11A-11D, resulting in the structure illustrated in the top view of FIG. 12A and cross-sectional views of FIGS. 12B-12D. In the illustrated embodiment the sidewall spacers 1000 comprise silicon and may be removed by etching using, for example, KOH or THMA.

Figure 13A:
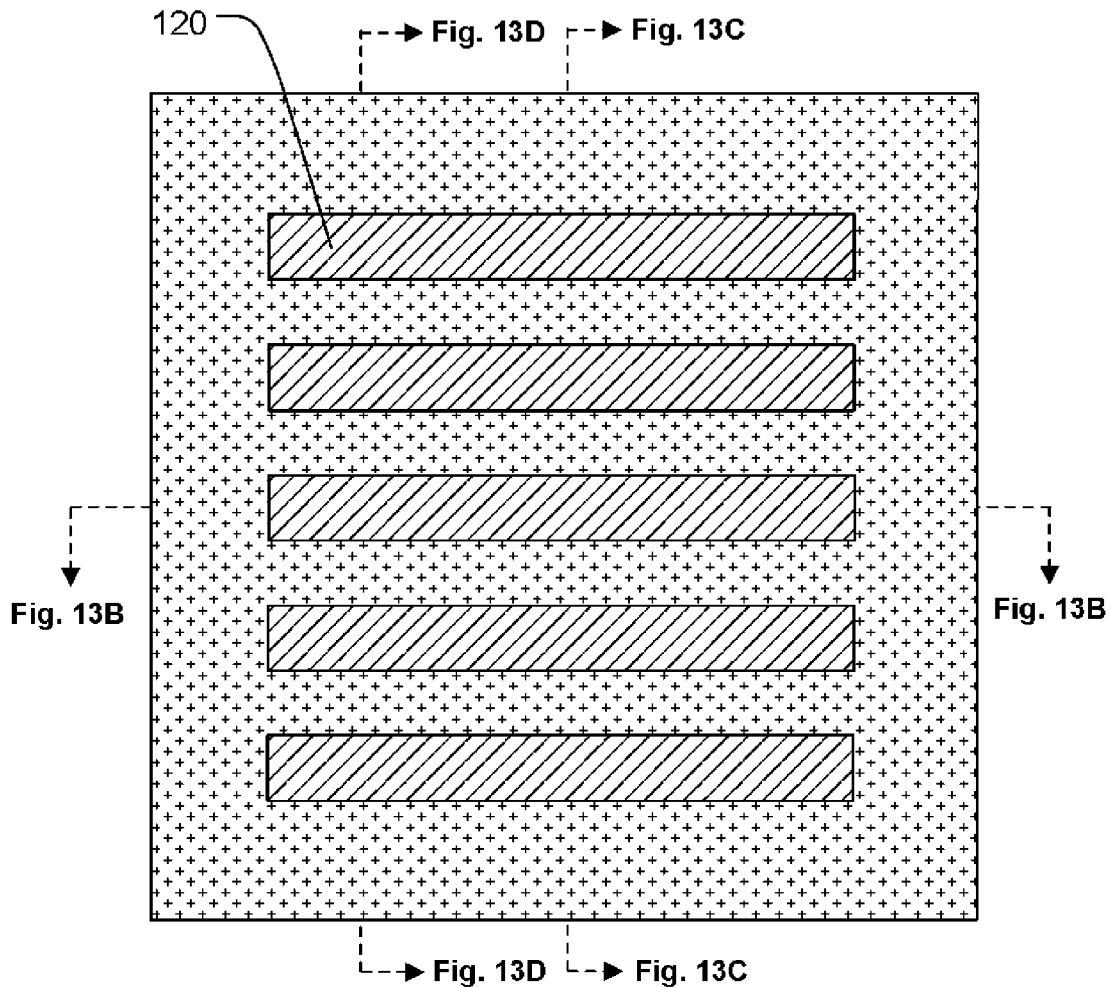
Figure 13B:
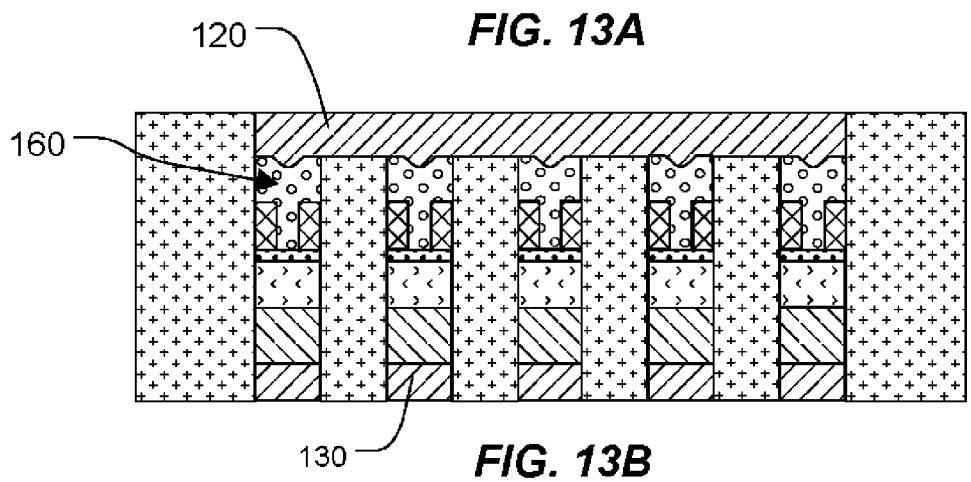
Figure 13C:
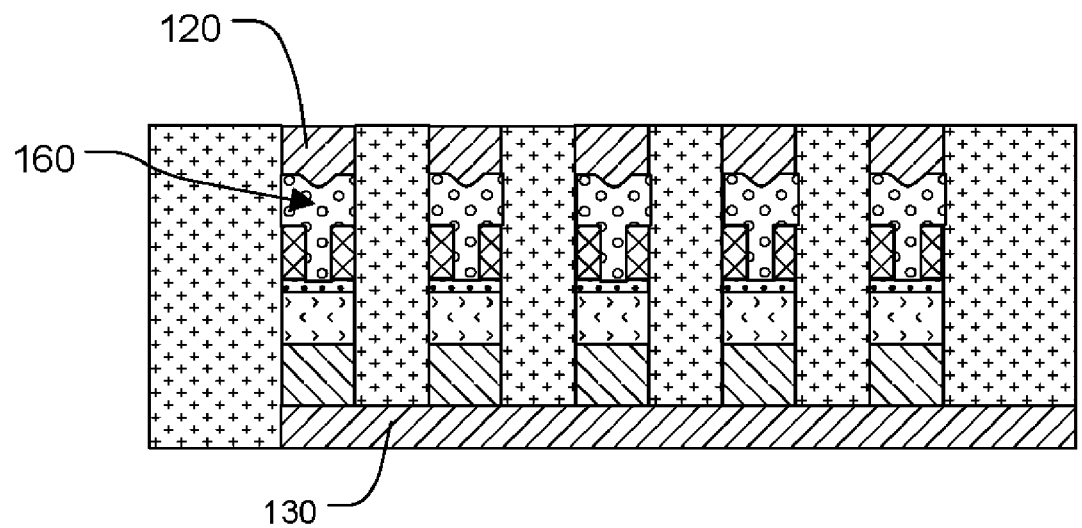
Figure 13D:
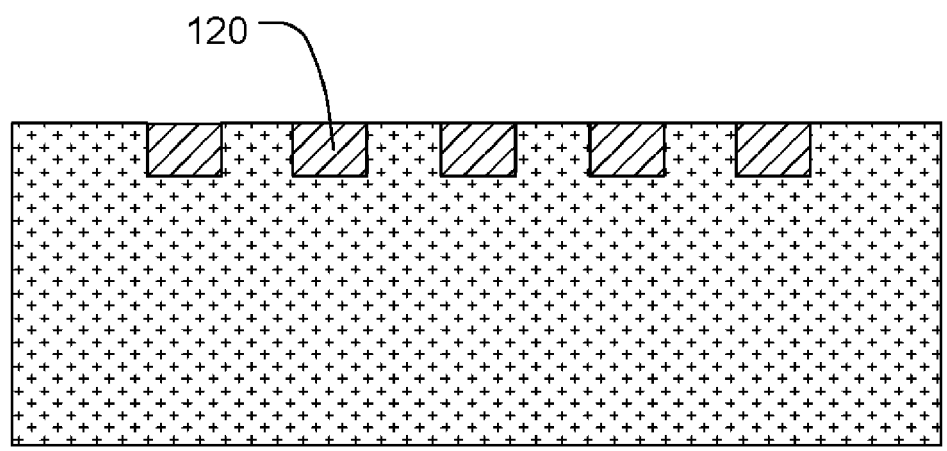

Next, memory elements 160 are formed within the vias 900 including a first portion within the opening 1100 defined by the sidewall spacer 140, and bit lines 120 are formed on the memory elements 160 and extend in the second direction, resulting in the structure illustrated the top view of FIG. 13A and the cross-sectional views of FIGS. 13B-13D. The memory elements 160 and bit lines 120 may be formed by depositing a layer of phase change material on the structure illustrated in FIGS. 12A-12D, etching back the phase change material using for example Reactive Ion Etching to form elements 160, and forming bit line material and performing a planarization process such as CMP to form the bit lines 120. Alternatively, the memory elements 160 and bit lines 120 may be formed by forming a layer of phase change material (having a thickness of about 90 nm for example) on the structure illustrated in FIGS. 12A-12D, forming a layer of bit line material (having a thickness of about 90 nm for example) on the layer of phase change material, and performing a planarizing process such as CMP.

As described above, the diode 121 was formed by the formation of the trenches 410 and 700 which also defined the word lines 130, the sacrificial elements 730, and the sacrificial strips 720. Since the sacrificial elements 730 and the sacrificial strips 720 defined the locations of the subsequently formed memory elements 260 and bit lines 120, it will be understood that the memory cells illustrated in FIG. 13A-13D are fully self-aligned.

Figure 14A:
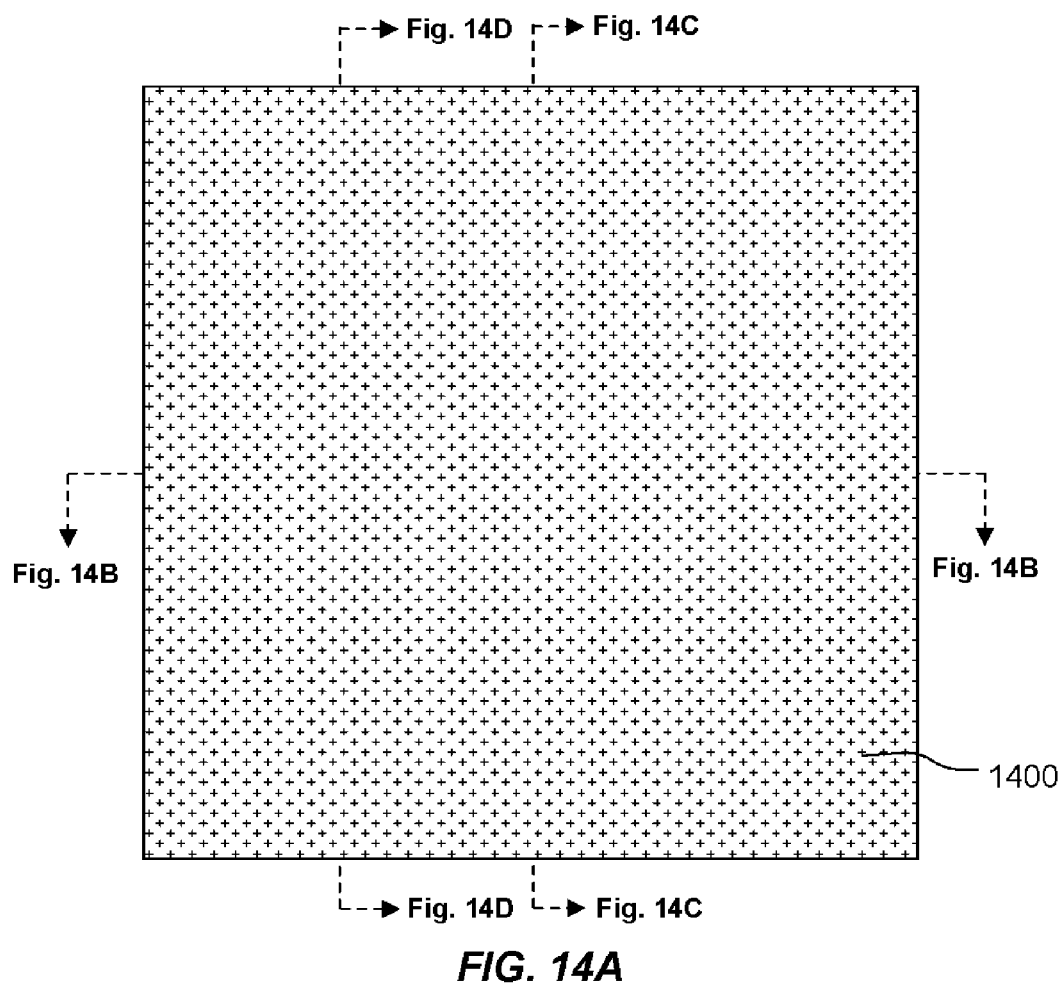
Figure 14B:
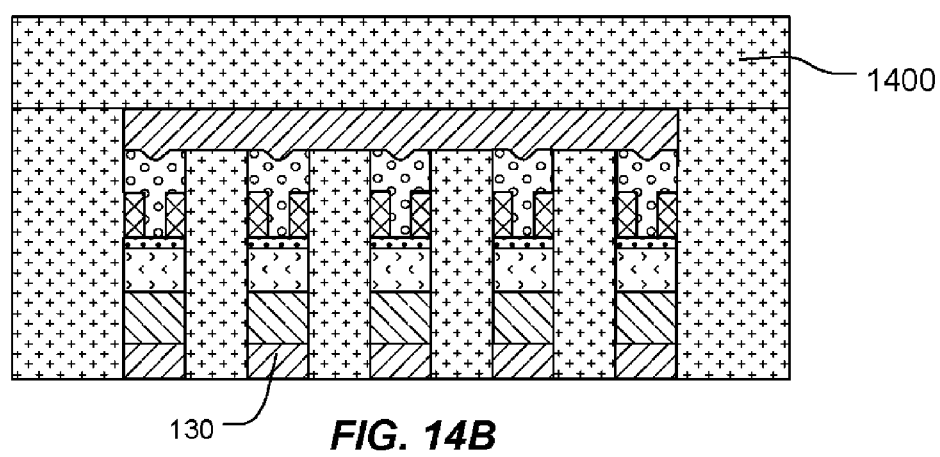
Figure 14C:
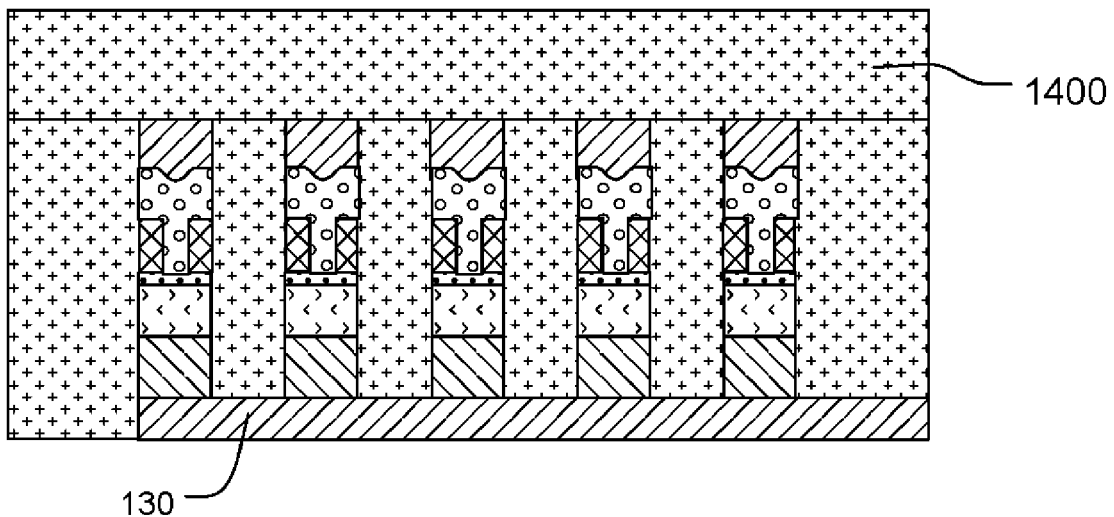
Figure 14D:
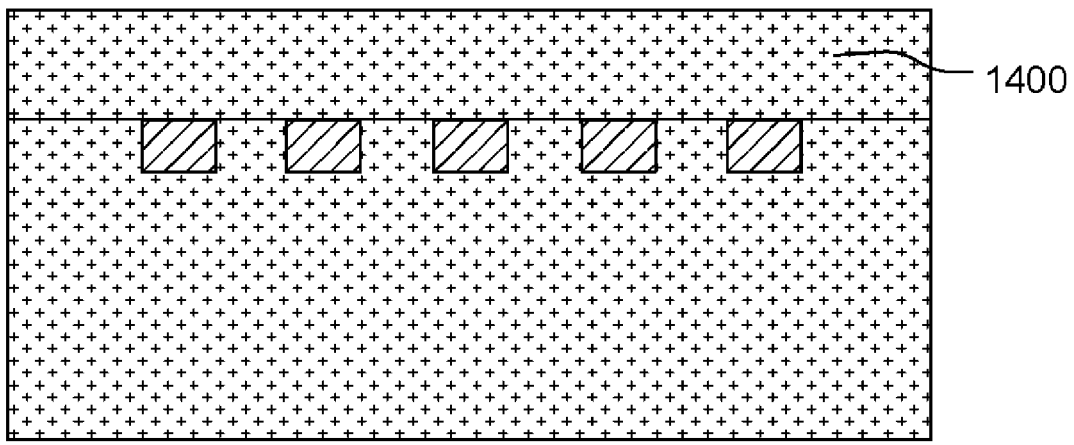
Figure 15A:
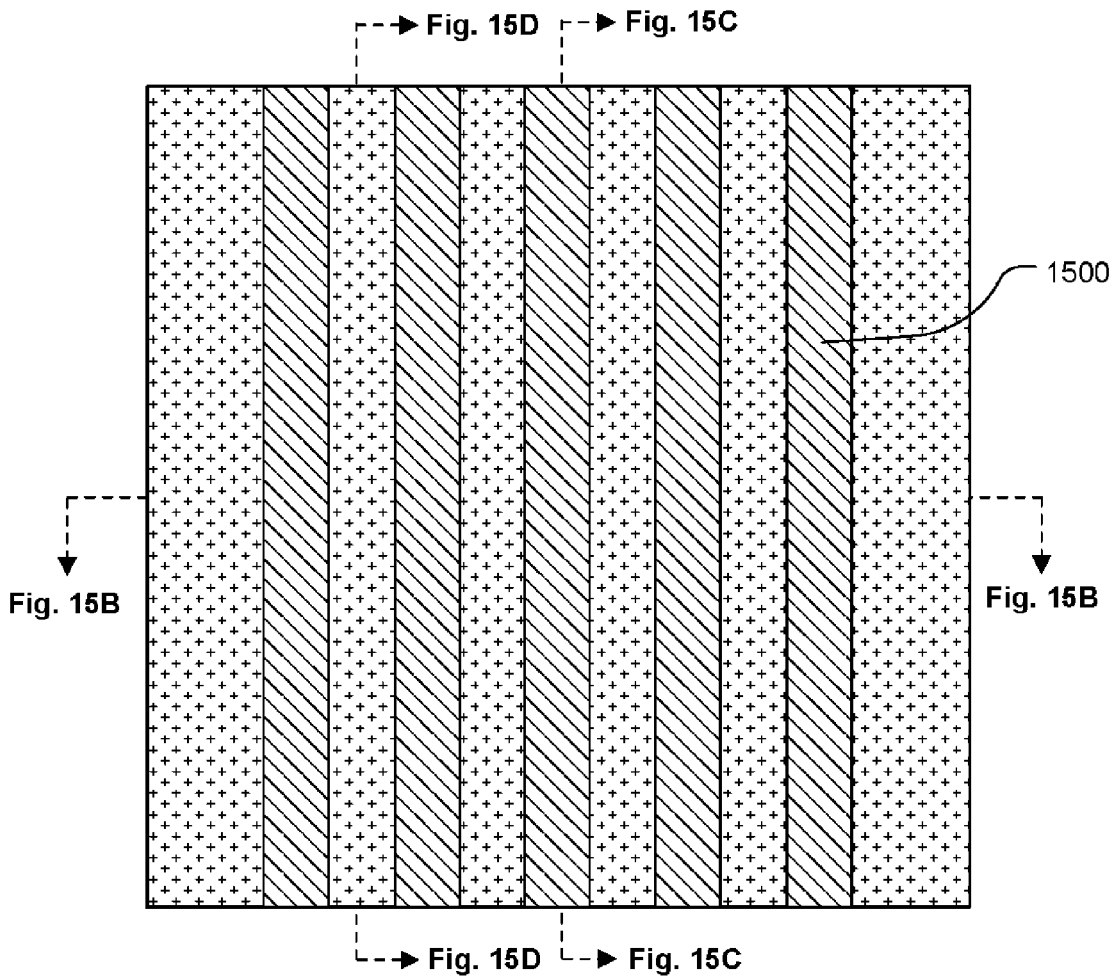
Figure 15B:
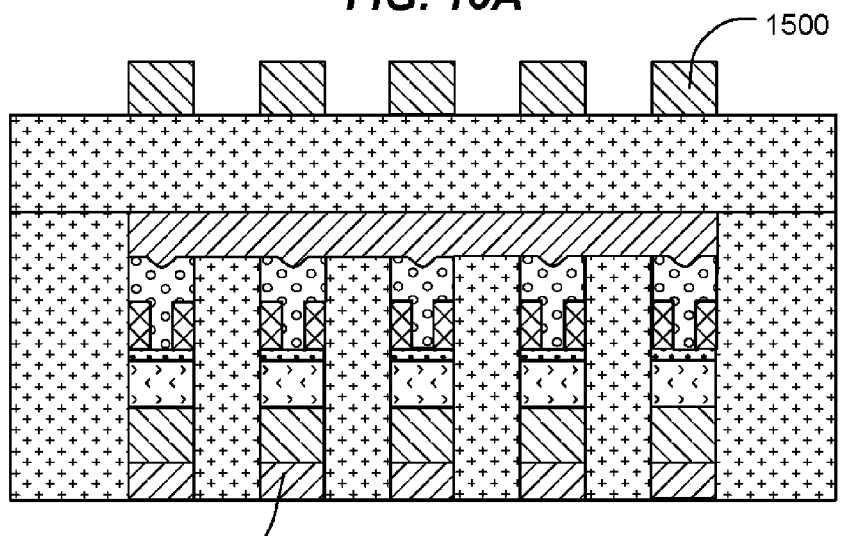
Figure 15C:
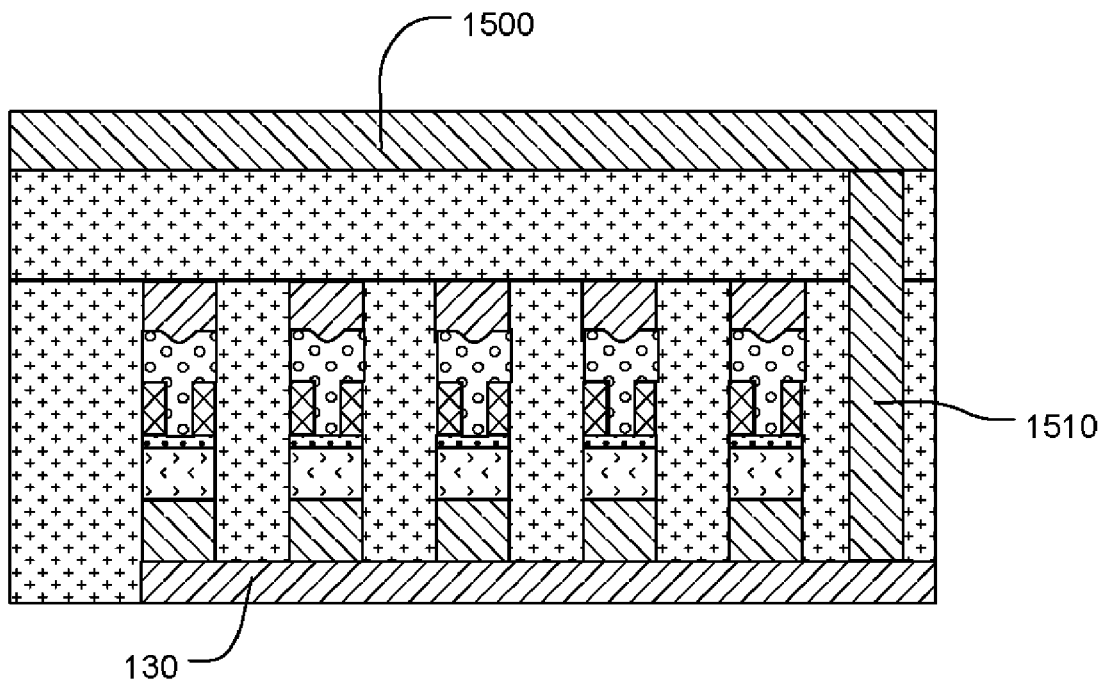
Figure 15D:
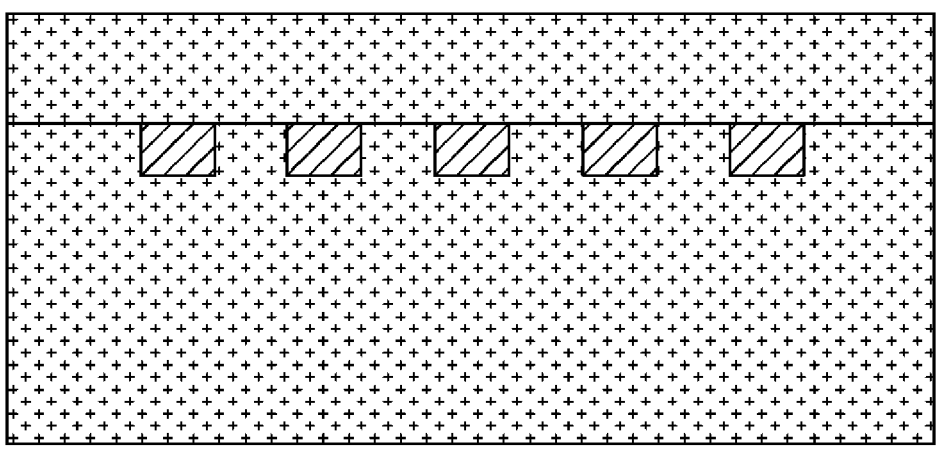

Next, an oxide layer 1400 is formed on the structure illustrated in FIGS. 13A-13D, resulting in the structure illustrated in the top view of FIG. 14A and the cross-sectional views of FIGS. 14B-14D.

Next, an array of conductive plugs 1510 are formed through the oxide layer 1400 to contact corresponding word lines 130, and global word lines 1500 are formed on the oxide layer 1400 and in contact with corresponding conductive plug 1510, resulting in the structure illustrated in FIGS. 15A-15D.

Figure 16A:
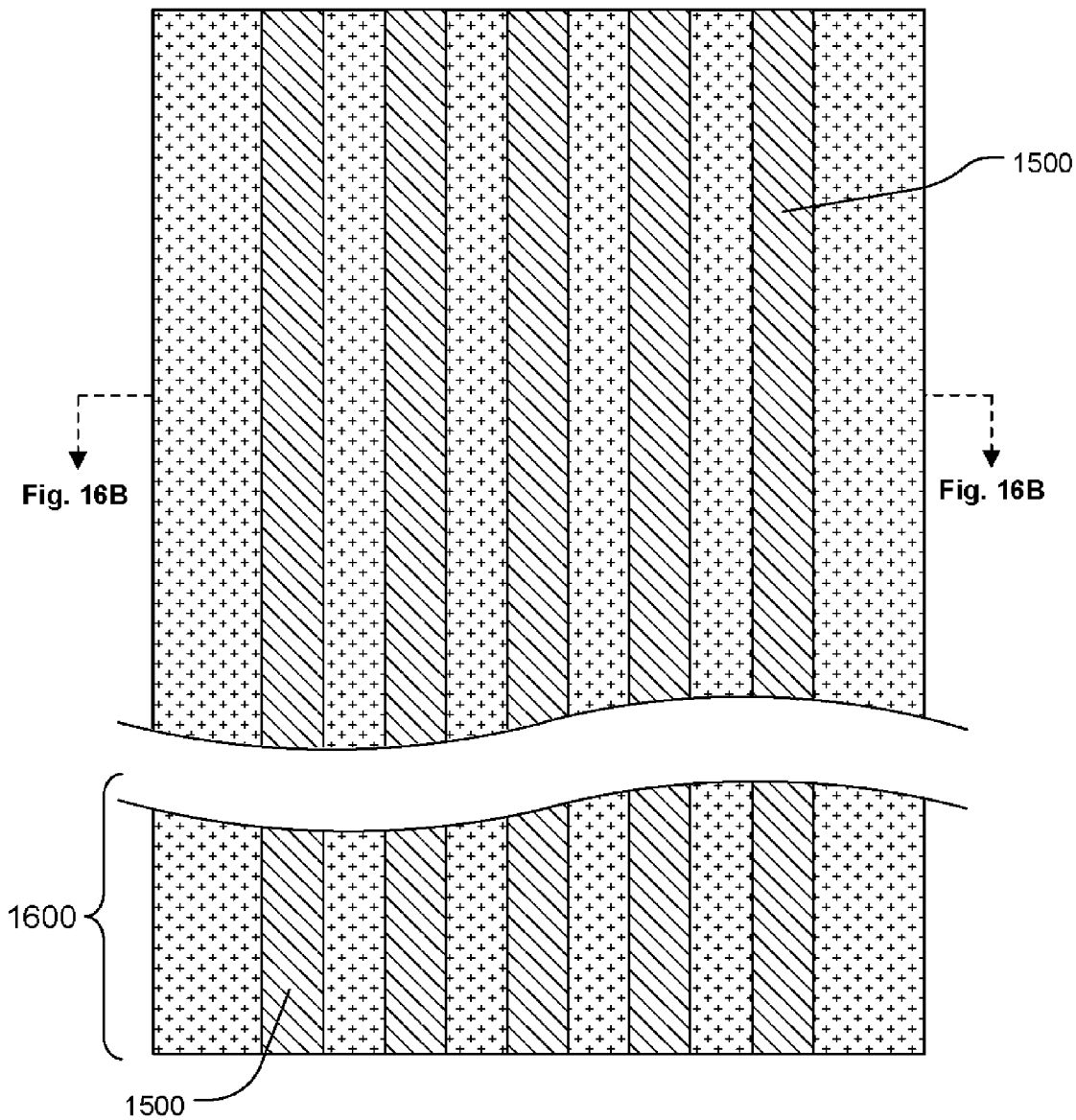
Figure 16B:
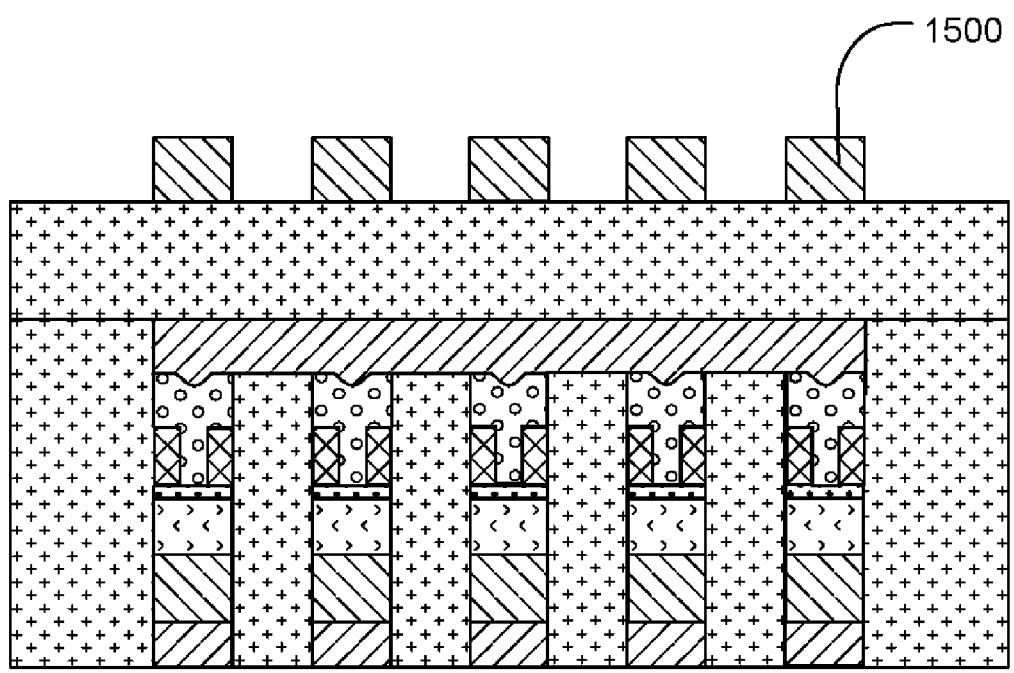

The global word lines 1500 extend to peripheral circuitry 1600 including CMOS devices as shown in the top view of FIG. 16A and the cross-sectional views of FIG. 16B.

Figure 17:
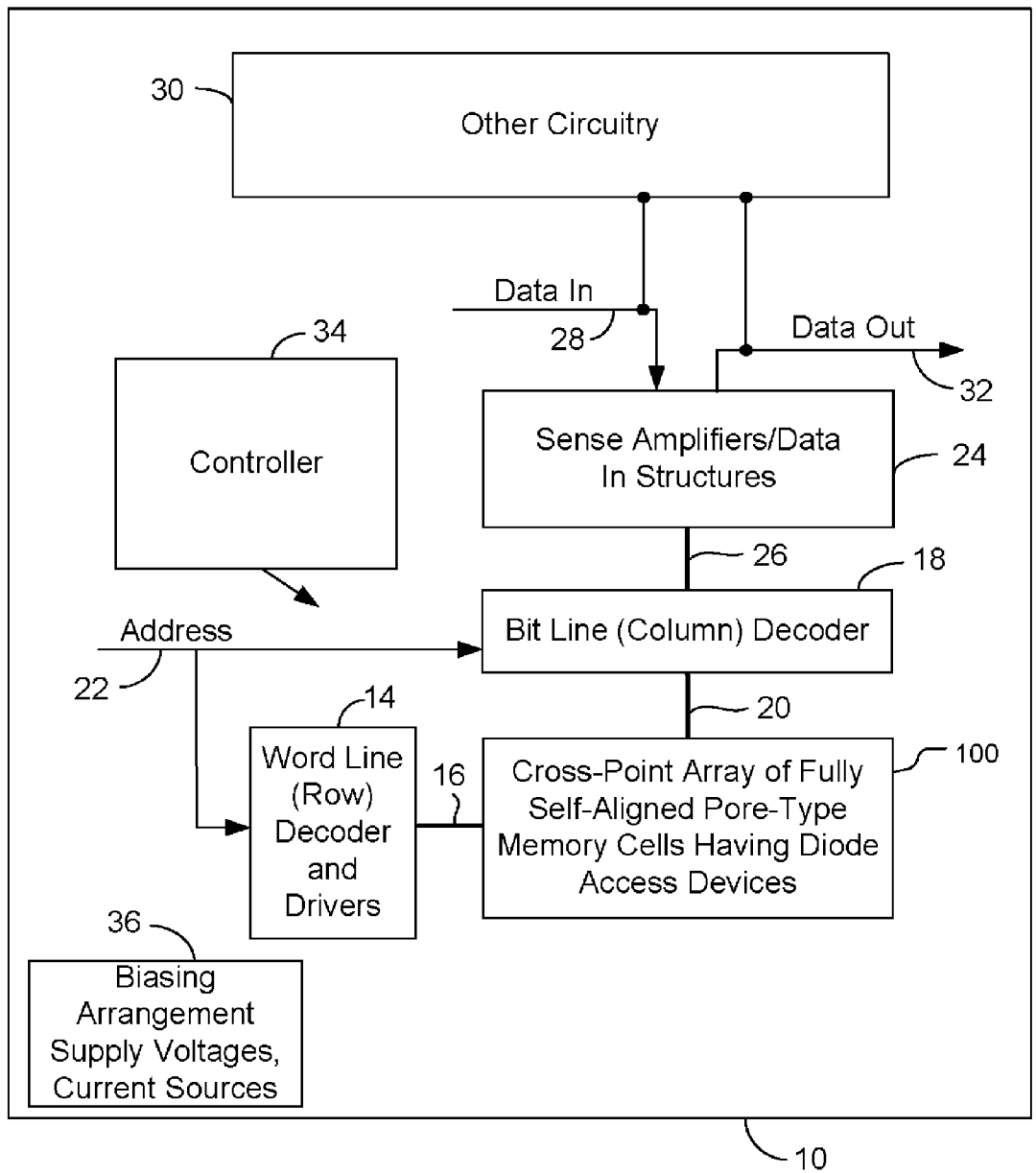
FIG. 17 is a simplified block diagram of an integrated circuit including a cross-point memory array of fully self-aligned memory cells having diode access devices as described herein.

FIG. 17 is a simplified block diagram of an integrated circuit 10 including a cross-point memory array 100 of fully self-aligned memory cells having diode access devices as described herein. A word line decoder 14 is coupled to and in electrical communication with a plurality of word lines 16. A bit line (column) decoder 18 is in electrical communication with a plurality of bit lines 20 to read data from, and write data to, the phase change memory cells (not shown) in array 100. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 100. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Embodiments of the memory cells described herein include phase change based memory materials, including chalcogenide based materials and other materials, for the memory element. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, GexSby, or other material that uses different crystal phase changes to determine resistance; $Pr_xCa_yMnO_3$, $Pr_xSr_yMnO_3$, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has a bistable or multi-stable resistance state controlled by an electrical pulse.

An exemplary method for forming chalcogenide material uses PVD-sputtering or magnetron-sputtering method with source gas(es) of Ar, N2, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising a plurality of memory cells, each memory cell in the plurality of memory cells comprising:
   a diode comprising a top contact surface, and a member comprising doped semiconductor material having an outside surface defining sides of the diode;
   an insulating layer over the diode, and including a first opening over the diode;
   a dielectric spacer within said first opening on the diode, the dielectric spacer having an inside surface defining a more narrow opening and having an outside surface defining sides of the dielectric spacer that are self-aligned with sides of the diode; and
   a memory element including a first portion within the more narrow opening and contacting the top contact surface of the diode, and including a second portion over the first portion within the first opening, the second portion having an outside surface defining sides self-aligned with the sides of the diode.

2. The device of claim 1, wherein the more narrow opening of each memory cell in the plurality of memory cells has a width less than a minimum feature size for a lithographic process used to form the memory device.

3. The device of claim 1, wherein the member comprising doped semiconductor material of the diode of each memory cell in the plurality of memory cells comprises:
   a first doped semiconductor region having a first conductivity type;
   a second doped semiconductor region on the first doped semiconductor region and having a second conductivity type opposite the first conductivity type; and
   a conductive cap on the second doped semiconductor region.

4. The device of claim 3, wherein:
   the first doped semiconductor region comprises n-type doped semiconductor material;

the second doped semiconductor region comprises p-type doped semiconductor material; and the conductive cap comprises a silicide.

5. The device of claim 1, wherein the opening of each memory cell in the plurality of memory cells is self-centered.

6. The device of claim 1, further comprising:

a plurality of word lines extending in a first direction;

a plurality of bit lines overlying the plurality of word lines and extending in a second direction, the bit lines crossing over the word lines at cross-point locations; and the plurality of memory cells at the cross-point locations, each memory cell in the plurality of memory cells in electrical communication with a corresponding word line in the plurality of word lines and a corresponding bit line in the plurality of bit lines.

7. The device of claim 6, wherein:

the diode, dielectric spacer, and memory element of each memory cell in the plurality of memory cells form a structure having first, second, third, and fourth sides;

the first and second sides of the structure of each memory cell in the plurality of memory cells self-aligned with sides of the corresponding word line; and the third and fourth sides of the structure of each memory cell in the plurality of memory cells is self-aligned with sides of the corresponding bit line.

8. A memory device comprising:

a plurality of memory cells;

a plurality of word lines extending in a first direction;

a plurality bit lines overlying the plurality of word lines and extending in a second direction, the bit lines crossing over the word lines at cross-point locations, the plurality of memory cells at the cross-point locations, each memory cell in the plurality of memory cells in electrical communication with a corresponding word line in the plurality of word lines and a corresponding bit line in the plurality of bit lines, and each memory cell in the plurality of memory cells comprising:

a diode comprising doped semiconductor material, a dielectric spacer on the diode and defining an opening, the dielectric spacer having sides self-aligned with sides of the diode, and a memory element on the dielectric spacer and including a portion within the opening contacting a top surface of the diode; and wherein the word lines have word line widths and adjacent word lines are separated by a word line separation distance;

the bit lines have bit line widths and adjacent bit lines are separated by a bit line separation distance; and each of the memory cells in the plurality of memory cells has a memory cell area, the memory cell area having a first side along the first direction and a second side along the second direction, the first side having a length equal to the summation of the bit line width and the bit line separation distance, the second side having a length equal to the summation of the word line width and the word line separation distance.

9. The device of claim 8, wherein the length of the first side is equal to twice a feature size F, and the length of the second side is equal to twice the feature size F, such that the memory cell area is equal to $4F^2$.

10. A method for manufacturing a memory device, the method comprising forming a plurality of memory cells, each memory cell in the plurality of memory cells comprising:

a diode comprising a top contact surface, and a member comprising doped semiconductor material having an outside surface defining sides of the diode;

an insulating layer over the diode, and including a first opening over the diode;

a dielectric spacer within said first opening on the diode, the dielectric spacer having an inside surface defining a more narrow opening and having an outside surface defining sides of the dielectric spacer that are self-aligned with sides of the diode; and a memory element including a first portion within the more narrow opening and contacting the top contact surface of the diode, and including a second portion over the first portion within the first opening, the second portion having an outside surface defining sides self-aligned with the sides of the diode.

11. The method of claim 10, wherein the more narrow opening of the each memory cell in the plurality of memory cells has a width less than a minimum feature size for a lithographic process used to form the memory device.

12. The method of claim 10, wherein the member comprising doped semiconductor material of the diode of each memory cell in the plurality of memory cells comprises:

a first doped semiconductor region having a first conductivity type;

a second doped semiconductor region on the first doped semiconductor region and having a second conductivity type opposite the first conductivity type; and a conductive cap on the second doped semiconductor region.

13. The method of claim 12, wherein:

the first doped semiconductor region comprises n-type doped semiconductor material;

the second doped semiconductor region comprises p-type doped semiconductor material; and the conductive cap comprises a silicide.

14. The method of claim 10, wherein the opening of each memory cell in the plurality of memory cells is self-centered.

15. The method of claim 10, further comprising:

forming a plurality of word lines extending in a first direction;

forming a plurality of bit lines overlying the plurality of word lines and extending in a second direction, the bit lines crossing over the word lines at cross-point locations; and forming the plurality of memory cells at the cross-point locations, each memory cell in the plurality of memory cells in electrical communication with a corresponding word line in the plurality of word lines and a corresponding bit line in the plurality of bit lines.

16. The method of claim 15, wherein:

the diode, dielectric spacer, and memory element of each memory cell in the plurality of memory cells form a structure having first, second, third, and fourth sides;

the first and second sides of the structure of each memory cell in the plurality of memory cells self-aligned with sides of the corresponding word line; and the third and fourth sides of the structure of each memory cell in the plurality of memory cells self-aligned with sides of the corresponding bit line.

17. A method for manufacturing a memory device, the method comprising:

forming a plurality of memory cells, forming a plurality of word lines extending in a first direction;

forming a plurality of bit lines overlying the plurality of word lines and extending in a second direction, the bit lines crossing over the word lines at cross-point locations; and forming the plurality of memory cells at the cross-point locations, each memory cell in the plurality of memory cells in electrical communication with a corresponding word line in the plurality of word lines and a corresponding bit line in the plurality of bit lines, each memory cell in the plurality of memory cells comprising:

a diode comprising doped semiconductor material;

a dielectric spacer on the diode and defining an opening, the dielectric spacer having sides self-aligned with sides of the diode; and a memory element on the dielectric spacer and including a portion within the opening contacting a top surface of the diode, and wherein:

the word lines have word line widths and adjacent word lines are separated by a word line separation distance;

the bit lines have bit line widths and adjacent bit lines are separated by a bit line separation distance; and each of the memory cells in the plurality of memory cells have a memory cell area, the memory cell area having a first side along the first direction and a second side along the second direction, the first side having a length equal to the summation of the bit line width and the bit line separation distance, the second side having a length equal to the summation of the word line width and the word line separation distance.

18. The method of claim 17, wherein the length of the first side is equal to twice a feature size F, and the length of the second side is equal to twice the feature size F, such that the memory cell area is equal to $4F^2$.

19. A method for manufacturing a memory device, the method comprising:

forming a structure comprising word line material, diode material on the word line material, dielectric spacer material on the diode material, and first sacrificial material on the dielectric spacer material;

forming a plurality of dielectric-filled first trenches in the structure extending in a first direction to define a plurality of strips, each strip including a word line comprising word line material;

forming second sacrificial material on the strips and the dielectric-filled first trenches;

forming a plurality of dielectric-filled second trenches down to the word lines and extending in a second direction to define a plurality of sacrificial strips comprising the second sacrificial material;

removing the first sacrificial material to define vias and removing the sacrificial strips to define trenches overlying the vias and extending in the second direction;

forming a plurality of dielectric spacers from the dielectric spacer material; and forming a plurality of memory elements and a plurality of bit lines within the vias and trenches.

20. The method of claim 19, further comprising:

forming an oxide layer on the bit lines;

forming an array of conductive plugs extending through the oxide layer to contact a corresponding word line; and forming a plurality of global word lines on the oxide layer and in contact with a corresponding conductive plug in the array of conductive plugs.

21. The method of claim 19, wherein the forming a plurality of dielectric spacers comprises:

forming sidewall spacers within the vias;

etching the dielectric spacer material using the sidewall spacers as an etch mask, thereby forming dielectric spacers comprising dielectric spacer material and defining openings; and removing the sidewall spacers.

22. The method of claim 21, wherein the forming a plurality of memory elements and a plurality of bit lines comprises:

forming memory material within the vias and the openings defined by the dielectric spacers;

forming bit line material on the memory material and in the trenches; and performing a planarizing process.

* * * * *